United States Patent
Kwag et al.

(10) Patent No.: US 11,373,587 B2
(45) Date of Patent: Jun. 28, 2022

(54) PIXEL AND DISPLAY APPARATUS INCLUDING SAME

(71) Applicant: SAMSUNG DISPLAY CO., LTD., Yongin-si (KR)

(72) Inventors: Jin Oh Kwag, Yongin-si (KR); Won Sik Oh, Yongin-si (KR); Keun Kyu Song, Yongin-si (KR); Sung-Chan Jo, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/284,337

(22) PCT Filed: Apr. 11, 2019

(86) PCT No.: PCT/KR2019/004387
§ 371 (c)(1),
(2) Date: Apr. 9, 2021

(87) PCT Pub. No.: WO2020/075937
PCT Pub. Date: Apr. 16, 2020

(65) Prior Publication Data
US 2021/0375194 A1    Dec. 2, 2021

(30) Foreign Application Priority Data

Oct. 12, 2018  (KR) .......................... 10-2018-0122088

(51) Int. Cl.
*G09G 3/32*       (2016.01)
*H01L 27/15*      (2006.01)

(52) U.S. Cl.
CPC ....... *G09G 3/32* (2013.01); *G09G 2300/0426* (2013.01); *G09G 2300/0809* (2013.01);
(Continued)

(58) Field of Classification Search
CPC ............. G09G 3/32; G09G 2300/0426; G09G 2300/0809; G09G 2310/08;
(Continued)

(56) References Cited

U.S. PATENT DOCUMENTS 7,537,947 B2 *  5/2009  Smith ................. H01L 27/3244
                                                             257/59
7,675,494 B2    3/2010  Hong et al.
(Continued)

FOREIGN PATENT DOCUMENTS

KR     10-1139527     5/2012
KR     10-1361983     2/2014
(Continued)

OTHER PUBLICATIONS

International Search Report, with English translation, corresponding to International Application No. PCT/KR2019/004387 dated Jul. 18, 2019.

(Continued)

*Primary Examiner* — Andrew Sasinowski
(74) *Attorney, Agent, or Firm* — Kile Park Reed & Houtteman PLLC

(57) ABSTRACT

A pixel includes first and second sub-emission areas enclosed by a bank; a first light source unit disposed in the first sub-emission area, and including at least one first light emitting element connected between at least one first split electrode and a second power supply; a second light source unit disposed in the second sub-emission area, and including at least one second light emitting element connected between at least one second split electrode and the second power supply; a first driving circuit connected between a first power supply and the at least one first split electrode, and supplying a first driving current to the first light source unit in response to a first data signal; and a second driving (Continued)

circuit connected between the first power supply and the second split electrode, and supplying a second driving current to the second light source unit in response to a second data signal.

20 Claims, 18 Drawing Sheets

(52) U.S. Cl.
CPC . *G09G 2310/08* (2013.01); *G09G 2320/0673* (2013.01); *H01L 27/156* (2013.01)

(58) Field of Classification Search
CPC ... G09G 2320/0673; G09G 2300/0842; G09G 3/3233; G09G 2300/0804; G09G 2300/0819; G09G 2300/0861; G09G 2320/0271; H01L 27/156; H01L 33/62; H01L 25/0753
See application file for complete search history.

(56) References Cited

U.S. PATENT DOCUMENTS

| | | | |
|---|---|---|---|
| 8,872,214 B2 | 10/2014 | Negishi et al. | |
| 8,987,765 B2 | 3/2015 | Bibl et al. | |
| 9,112,112 B2 | 8/2015 | Do et al. | |
| 10,068,517 B2 | 9/2018 | Whangbo | |
| 10,074,300 B2 | 9/2018 | Yeon et al. | |
| 10,078,980 B2 | 9/2018 | Kong et al. | |
| 2010/0265235 A1* | 10/2010 | Lee | G09G 3/3655 345/87 |
| 2011/0089850 A1 | 4/2011 | Shibata et al. | |
| 2013/0135324 A1* | 5/2013 | Hong | G09G 3/3466 359/290 |
| 2016/0197195 A1* | 7/2016 | Jung | G02F 1/133 257/53 |
| 2021/0256919 A1* | 8/2021 | French | G09G 3/348 |
| 2021/0256920 A1* | 8/2021 | Bishop | G02B 26/005 |

FOREIGN PATENT DOCUMENTS

| | | |
|---|---|---|
| KR | 10-2016-0010537 | 1/2016 |
| KR | 10-2016-0101572 | 8/2016 |
| KR | 10-2017-0001808 | 1/2017 |
| KR | 10-2017-0013469 | 2/2017 |
| KR | 10-2017-0121676 | 11/2017 |
| KR | 10-2018-0024618 | 3/2018 |
| KR | 10-2020-0040347 | 4/2020 |

OTHER PUBLICATIONS

Written Opinion, with English translation, corresponding to International Application No. PCT/KR2019/004387, dated Jul. 18, 2019.

* cited by examiner

FIG. 3A
FIG. 3B
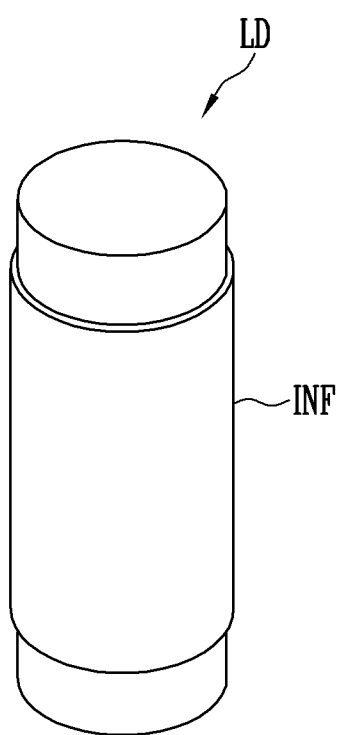
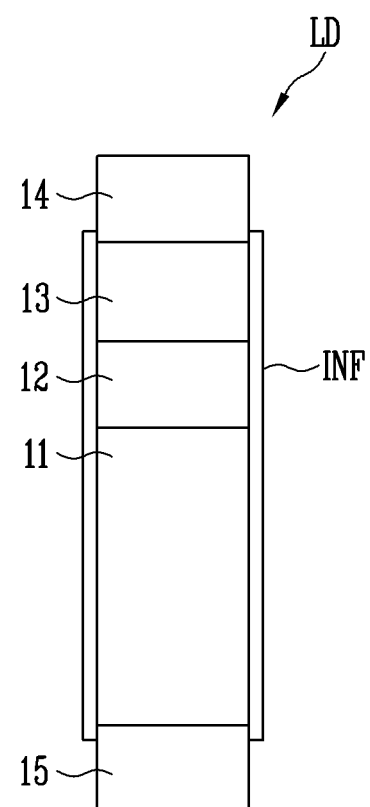

PIXEL AND DISPLAY APPARATUS INCLUDING SAME

CROSS-REFERENCE TO RELATED APPLICATION(S)

This application is a national entry of International Application No. PCT/KR2019/004387, filed on Apr. 11, 2019, which claims under 35 U.S.C. §§ 119(a) and 365(b) priority to and benefits of Korean Patent Application No. 10-2018-0122088, filed on Oct. 12, 2018 in the Korean Intellectual Property Office, the entire contents of which are incorporated herein by reference.

BACKGROUND

1. Technical Field

Various embodiments of the disclosure relate to a pixel and a display device including the pixel.

2. Description of the Related Art

Recently, a technique of manufacturing a subminiature light emitting element using a material having a reliable inorganic crystal structure and manufacturing a display device using the light emitting element has been developed. For example, a technique of manufacturing subminiature light emitting elements having a small size in a range of the nanoscale to the microscale and forming a light source of each pixel using the subminiature light emitting elements has been developed.

SUMMARY

Various embodiments of the disclosure are directed to a pixel including light emitting elements, and a display device including the pixel.

A pixel in accordance with an embodiment of the disclosure may include a first sub-emission area and a second sub-emission area that are enclosed by a bank; a first light source unit disposed in the first sub-emission area, the first light source unit including at least one first light emitting element electrically connected between at least one first split electrode and a second power supply; a second light source unit disposed in the second sub-emission area, the second light source unit including at least one second light emitting element electrically connected between at least one second split electrode separated from the at least one first split electrode and the second power supply; a first driving circuit electrically connected between a first power supply and the at least one first split electrode, and supplying a first driving current to the first light source unit in response to a first data signal supplied to a first data line; and a second driving circuit electrically connected between the first power supply and the at least one second split electrode, and supplying a second driving current to the second light source unit in response to a second data signal supplied to a second data line.

In an embodiment, the first data signal may be a data signal obtained by applying a first gamma value to each pixel data, and the second data signal may be a data signal obtained by applying a second gamma value to each pixel data.

In an embodiment, the first driving circuit may include a first driving transistor electrically connected between the first power supply and the at least one first split electrode, the first driving transistor comprising a gate electrode electrically connected to a first node; a first switching transistor electrically connected between one electrode of the first driving transistor and the first data line, the first switching transistor comprising a gate electrode electrically connected to a scan line; and a first capacitor electrically connected between the first power supply and the first node.

In an embodiment, the second driving circuit may include a second driving transistor electrically connected between the first power supply and the at least one second split electrode, the second driving transistor comprising a gate electrode electrically connected to a second node; a second switching transistor electrically connected between one electrode of the second driving transistor and the second data line, the second switching transistor comprising a gate electrode electrically connected to the scan line; and a second capacitor electrically connected between the first power supply and the second node.

In an embodiment, a surface area of the first sub-emission area and a surface area of the second sub-emission area may be equal to each other, a number of the at least one first split electrode and a number of the at least one second split electrode may be equal to each other, and a size of the at least one first split electrode and a size of the at least one second split electrode may be equal to each other.

In an embodiment, a surface area of the first sub-emission area and a surface area of the second sub-emission area may be different from each other, a number of the at least one first split electrode and a number of the at least one second split electrode may be different from each other, and a size of the at least one first split electrode and a size of the at least one second split electrode may be different from each other.

In an embodiment, the pixel may further include a diode electrically connected in a direction between the first data line and the second data line.

In an embodiment, the first and second data signals may have different voltage levels.

A display device in accordance with an embodiment of the disclosure may include a timing controller that outputs frame data in response to input image data; a data driver that generates at least one data signal for each pixel in response to the frame data, and outputs the data signal to data lines; and a plurality of pixels each electrically connected to at least one data line and emitting light of a luminance corresponding to each of the at least one data signal supplied to the at least one data line. Each of the plurality of pixels may include a first sub-emission area and a second sub-emission area that are enclosed by a bank; a first light source unit disposed in the first sub-emission area, the first light source unit including at least one first light emitting element electrically connected between at least one first split electrode and a second power supply; a second light source unit disposed in the second sub-emission area, the second light source unit including at least one second light emitting element electrically connected between at least one second split electrode separated from the at least one first split electrode and the second power supply; a first driving circuit electrically connected between a first power supply and the at least one first split electrode, and supplying a first driving current to the first light source unit in response to a first data signal supplied to a first data line; and a second driving circuit electrically connected between the first power supply and the at least one second split electrode, and supplying a second driving current to the second light source unit in response to a second data signal supplied to a second data line.

In an embodiment, each of the plurality of pixels may be electrically connected to two different channels of the data driver through the first and the second data lines.

In an embodiment, the timing controller may include a gamma storage that stores a first gamma value and a second gamma value different from each other for each of the plurality of pixels; and a data converter that generates first and second converted data by respectively applying the first and the second gamma values to pixel data corresponding to each of the plurality of pixels.

In an embodiment, the data driver may generate the first and the second data signals respectively in response to the first and the second converted data, and the data driver may output the first and the second data signals respectively to the first and the second data lines.

In an embodiment, the data driver may generate the first and the second data signals by respectively applying first and second gamma values to pixel data corresponding to each of the plurality of pixels, and the data driver may output the first and the second data signals respectively to the first and the second data lines.

In an embodiment, each of the plurality of pixels may include a diode electrically connected in a direction between the first data line and the second data line.

In an embodiment, each of the plurality of pixels may be electrically connected to each channel of the data driver through one of the first and the second data lines.

In an embodiment, the first data line may be supplied with the first data signal obtained by applying a first gamma value to pixel data corresponding to each of the plurality of pixels. The second data line may be supplied with the second data signal obtained by applying a second gamma value to the pixel data corresponding to each of the plurality of pixels.

In an embodiment, the first driving circuit may include a first driving transistor electrically connected between the first power supply and the at least one first split electrode, the first driving transistor comprising a gate electrode electrically connected to a first node; a first switching transistor electrically connected between one electrode of the first driving transistor and the first data line, the first switching transistor comprising a gate electrode electrically connected to a scan line; and a first capacitor electrically connected between the first power supply and the first node.

In an embodiment, the second driving circuit may include a second driving transistor electrically connected between the first power supply and the at least one second split electrode, the second driving transistor comprising a gate electrode electrically connected to a second node; a second switching transistor electrically connected between one electrode of the second driving transistor and the second data line, the second switching transistor comprising a gate electrode electrically connected to the scan line; and a second capacitor electrically connected between the first power supply and the second node.

In an embodiment, a surface area of the first sub-emission area and a surface area of the second sub-emission area may be equal to each other, a number of the at least one first split electrode and a number of the at least one second split electrode may be equal to each other, and a size of the at least one first split electrode and a size of the at least one second split electrode may be equal to each other.

In an embodiment, a surface area of the first sub-emission area and a surface area of the second sub-emission area may be different from each other, a number of the at least one first split electrode and a number of the at least one second split electrode may be different from each other, and a size of the at least one first split electrode and a size of the at least one second split electrode may be different from each other.

In accordance with various embodiments of the disclosure, low gray scale expression capability of a pixel including light emitting elements and a display device including the pixel may be enhanced.

BRIEF DESCRIPTION OF THE DRAWINGS

An additional appreciation according to the embodiments of the disclosure will become more apparent by describing in detail the embodiments thereof with reference to the accompanying drawings, wherein:

FIGS. 3A and 3B schematically illustrate a light emitting element in accordance with an embodiment of the disclosure.

DETAILED DESCRIPTION OF THE EMBODIMENTS

Figure 1A:
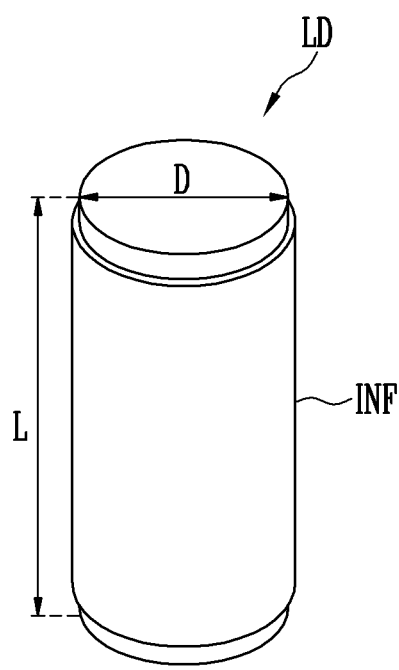
FIGS. 1A and 1B schematically illustrate a light emitting element in accordance with an embodiment of the disclosure.

Reference will now be made in detail to various embodiments of the disclosure, specific examples of which are illustrated in the accompanying drawings and described below, since the embodiments of the disclosure can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to denote (or designate) the same or similar elements throughout the drawings, and repetitive explanation will be omitted.

It will be understood that, although the terms "first," "second," and the like may be used herein to describe various elements, these elements should not be limited by these terms. It will be further understood that the terms "comprise," "include," "have," and the like when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part, but a third component or part may intervene between them. Furthermore, when a first component or part is coupled or connected to a second component or part, the first component or part may be directly coupled or connected to the second component or part, or a third component or part may be coupled or connected between the first and second components or parts.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

Embodiments and required details of the disclosure are described with reference to the accompanying drawings in order to describe the disclosure in detail so that those having ordinary knowledge in the technical field to which the disclosure pertains can readily practice the disclosure. Furthermore, a singular form may include a plural form unless it is clearly defined or implied otherwise herein.

FIGS. 1A, 1B, 2A, 2B, 3A, and 3B schematically illustrate respective light emitting elements LD in accordance with embodiments. In detail, FIGS. 1A, 1B, 2A, 2B, 3A, and 3B are perspective views and cross-sectional views of the light emitting elements LD in accordance with different embodiments. Although FIGS. 1A to 3B illustrate that each light emitting element LD is a cylindrical rod-type light emitting diode, the kind and/or shape of the light emitting element LD in accordance with the disclosure is not limited thereto.

Figure 1B:
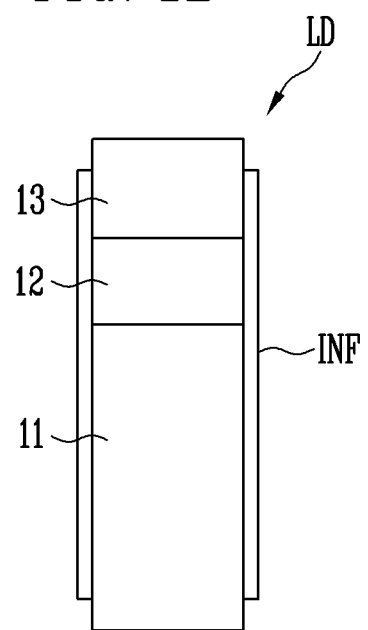

Referring to FIGS. 1A and 1B, a light emitting element LD (e.g., a light emitting diode) in accordance with an embodiment may include a first conductivity type semiconductor layer 11 (also referred to as "first semiconductor layer"), a second conductivity type semiconductor layer 13 (also referred to as "second semiconductor layer"), and an active layer 12 interposed between the first and second conductivity type semiconductor layers 11 and 13. For example, the light emitting element LD may be configured of (or formed of) a stacked body formed by successively stacking the first conductivity type semiconductor layer 11, the active layer 12, and the second conductivity type semiconductor layer 13.

In an embodiment, the light emitting element LD may be provided in the form of a rod extending in a direction. If the direction in which the light emitting element LD extends is defined as a longitudinal direction, the light emitting element LD may include a first end and a second end in the longitudinal direction.

In an embodiment, one of the first and second conductivity type semiconductor layers 11 and 13 may be disposed on the first end of the light emitting element LD, and the other of the first and second conductivity type semiconductor layers 11 and 13 may be disposed on the second end of the light emitting element LD.

In an embodiment, the light emitting element LD may be a rod-type light emitting diode manufactured in the form of a rod. In this specification, the term "rod-type shape" embraces a rod-like shape or a bar-like shape such as a cylindrical shape or a prismatic shape extending in a longitudinal direction (for example, having an aspect ratio greater than 1), and the cross-sectional shape thereof is not limited to a particular shape. For example, a length L of the light emitting element LD may be greater than a diameter D thereof (or a width of the cross-section thereof).

In an embodiment, the light emitting element LD may have a small size in a range of the nanoscale to the microscale, e.g., a diameter D and/or a length L in a range of the nanoscale to the microscale. However, in the disclosure, the size of the light emitting element LD is not limited thereto. For example, the size of the light emitting element LD may be changed in various ways depending on design conditions of various devices, e.g., a pixel, which employs, as a light source, a light emitting device using a light emitting element LD.

The first conductivity type semiconductor layer 11 may include, for example, at least one n-type semiconductor layer. For instance, the first conductivity type semiconductor layer 11 may include an n-type semiconductor layer which includes any one semiconductor material of InAlGaN, GaN, AlGaN, InGaN, AlN, and InN and is doped with a first conductive dopant such as Si, Ge, or Sn. However, the material for forming the first conductivity type semiconductor layer 11 is not limited thereto, and the first conductivity type semiconductor layer 11 may be formed of (or include) various other materials.

The active layer 12 may be disposed on the first conductivity type semiconductor layer 11 and have a single or multiple quantum well structure. In an embodiment, a cladding layer (not shown) doped with a conductive dopant may be formed over and/or under the active layer 12. For example, the cladding layer may be formed of an AlGaN layer or an InAlGaN layer. In an embodiment, a material such as AlGaN or AlInGaN may be used to form the active layer 12, or various other materials may be used to form the active layer 12.

If an electric field having a predetermined voltage or greater is applied to the opposite ends of the light emitting element LD, the light emitting element LD may emit light by recombination of electron-hole pairs in the active layer 12. Since light emission of the light emitting element LD can be controlled based on the foregoing principle, the light emitting element LD may be used as a light source of various light emitting devices including a pixel of the display device.

The second conductivity type semiconductor layer 13 may be disposed on the active layer 12 and include a semiconductor layer of a type different from that of the first conductivity type semiconductor layer 11. For example, the second conductivity type semiconductor layer 13 may include at least one p-type semiconductor layer. For instance, the second conductivity type semiconductor layer 13 may include a p-type semiconductor layer which includes any one semiconductor material of InAlGaN, GaN, AlGaN, InGaN, AlN, and InN and is doped with a second conductive dopant such as Mg. However, the material for forming the second conductivity type semiconductor layer 13 is not limited thereto, and the second conductivity type semiconductor layer 13 may be formed of various other materials.

In an embodiment, the light emitting element LD may further include an insulating film INF provided on the surface of the light emitting element LD. The insulating film INF may be formed on the surface of the light emitting element LD to enclose an outer circumferential surface of at least the active layer 12 and may further enclose an area of each of the first and second conductivity type semiconductor layers 11 and 13. Here, the insulating film INF may allow the opposite ends of the light emitting element LD that have different polarities to be exposed to the outside. For example, the insulating film INF may expose an end of each of the first and second conductivity type semiconductor layers 11 and 13 that are disposed on the respective opposite ends of the light emitting element LD in the longitudinal direction, e.g., may expose two base sides (top and bottom surfaces) of the cylinder rather than covering the base sides.

In an embodiment, the insulating film INF may include at least one insulating material of $SiO_2$, $Si_3N_4$, $Al_2O_3$, and $TiO_2$, but the disclosure is not limited thereto. The material that forms the insulating film INF is not limited to a particular material, and the insulating film INF may be formed of various known insulating materials.

In an embodiment, the light emitting element LD may further include additional components as well as the first conductivity type semiconductor layer 11, the active layer 12, the second conductivity type semiconductor layer 13, and/or the insulating film INF. For example, the light emitting element LD may further include at least one fluorescent layer, at least one active layer, at least one semiconductor layer, and/or at least one electrode layer disposed on an end of the first conductivity type semiconductor layer 11, the active layer 12, and/or the second conductivity type semiconductor layer 13.

Figure 2A:
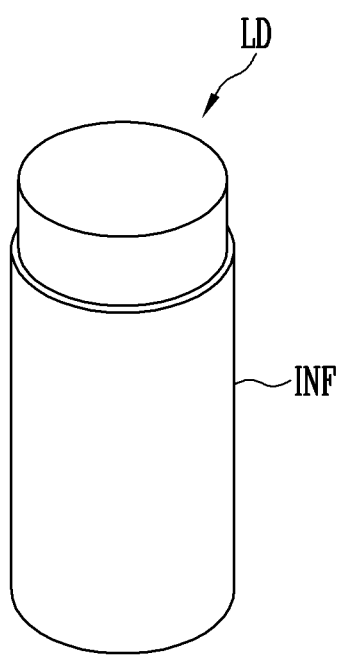
FIGS. 2A and 2B schematically illustrate a light emitting element in accordance with an embodiment of the disclosure.
Figure 2B:
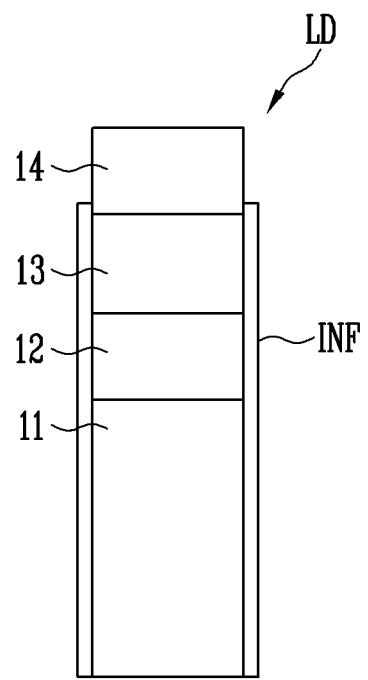

For example, as illustrated in FIGS. 2A and 2B, the light emitting element LD may further include at least one electrode layer 14 disposed on an end of the second conductivity type semiconductor layer 13. In an embodiment, as illustrated in FIGS. 3A and 3B, the light emitting element LD may further include at least one electrode layer 15 disposed on an end of the first conductivity type semiconductor layer 11.

Each of the electrode layers 14 and 15 may be an ohmic contact electrode, but the disclosure is not limited thereto. Furthermore, each of the electrode layers 14 and 15 may include metal or a metal oxide. For example, Cr, Ti, Al, Au, Ni, ITO, IZO, ITZO, and an oxide or alloy thereof may be used alone or in combination. In an embodiment, the electrode layers 14 and 15 may be substantially transparent or translucent. Therefore, light generated from the light emitting element LD may be emitted to the outside through the electrode layers 14 and 15.

In an embodiment, the insulating film INF may or may not at least partially enclose the outer circumferential surfaces of the electrode layers 14 and 15. In other words, the insulating film INF may be selectively formed on the surfaces of the electrode layers 14 and 15. Furthermore, the insulating film INF may be formed to expose the opposite ends of the light emitting element LD that have different polarities, for example, may expose at least an area of each of the electrode layers 14 and 15. As another example, in an embodiment, the insulating film INF may not be provided.

If the insulating film INF is provided on the surface of the light emitting element LD, particularly, on the surface of the active layer 12, the active layer 12 may be prevented from short-circuiting with at least one electrode which is not shown (e.g., at least one contact electrode of contact electrodes connected to the opposite ends of the light emitting element LD), etc. Therefore, the electrical stability of the light emitting element LD may be secured.

Furthermore, thanks to the insulating film INF formed on the surface of the light emitting element LD, occurrence of a defect on the surface of the light emitting element LD may be reduced or minimized, whereby the lifetime and efficiency of the light emitting element LD may be improved. If the insulating film INF is formed on each light emitting element LD, in case that light emitting elements LD are disposed adjacent to each other, the light emitting elements LD may be prevented from undesirably short-circuiting.

The light emitting element LD may be fabricated by a surface treatment process. For example, the light emitting element LD may be surface-treated (e.g., by a coating process) so that in case that light emitting elements LD are mixed with a fluidic solution and then supplied to each emission area (e.g., an emission area of each pixel), the light emitting elements LD can be evenly distributed rather than unevenly aggregating in the solution.

A light emitting device including the light emitting element LD described above may be used not only in a display device but also in various devices which include a light source. For instance, at least one subminiature light emitting element LD, e.g., subminiature light emitting elements LD each having a size ranging from the nanoscale to the microscale, may be disposed in each pixel area of a display panel so as to form a light source (or light source unit) of the corresponding pixel. Furthermore, the field of application of the light emitting element LD according to the disclosure is not limited to a display device. For example, the light emitting element LD may also be used in other types of devices such as a lighting device, which includes a light source.

Figure 4:
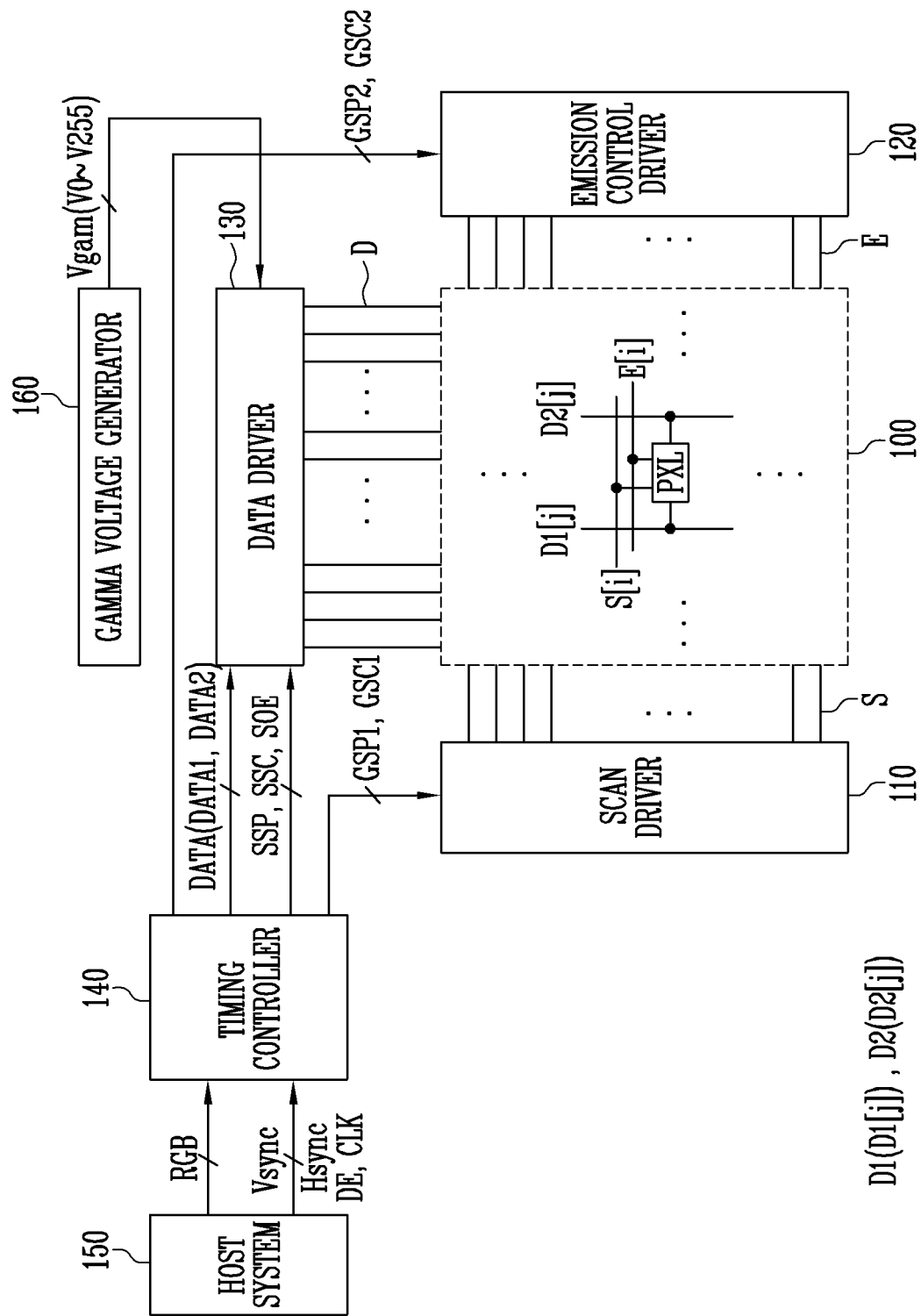
FIG. 4 schematically illustrates a display device in accordance with an embodiment of the disclosure.

FIG. 4 illustrates a display device in accordance with an embodiment of the disclosure.

Referring to FIG. 4, the display device in accordance with an embodiment may include a pixel unit 100, a scan driver 110, an emission control driver 120, a data driver 130, a timing controller 140, a host system 150, and a gamma voltage generator 160.

The pixel unit 100 may be a display area in which an image is displayed and may include pixels PXL to display an image corresponding to input image data RGB. For example, the pixel unit 100 may include scan lines S, emission control lines E, data lines D, and pixels PXL electrically connected to the scan lines S, the emission control lines E, and the data lines D. In this specification, the term "coupling", "connecting" or "connected" may mean "physical and/or electrical connecting." For example, the pixels PXL may be electrically coupled or connected to the scan lines S, the emission control lines E, and the data lines D. The emission control lines E may be selectively formed in the pixel unit 100 depending on the structure and/or driving method of the pixels PXL.

In an embodiment, each pixel PXL may be electrically connected to at least one scan line S, an emission control line E, and data lines D. For example, a pixel PXL disposed on an i-th (where i is a natural number) horizontal line (for example, an i-th horizontal pixel column) and a j-th (where j is a natural number) vertical line (for example, a j-th vertical pixel column) of the pixel unit 100 may be electrically connected to an i-th scan line S[i] (also referred to as "scan line S[i]"), an i-th emission control line E[i] (also referred to as "emission control line E[i]"), a j-th first data line D1[j] (also referred to as "first data line D1[j]"), and a j-th second data line D2[j] (also referred to as "second data line D2[j]"). In this case, each pixel PXL may be electrically connected to two different channels of the data driver 130 through the j-th first and second data lines D1[j] and D2[j].

Furthermore, each pixel PXL may be further electrically connected to at least one control line, e.g., an initialization control line. In an embodiment, the initialization control line may be one of scan lines S, but the disclosure is not limited thereto.

In an embodiment, the pixels PXL may include light source units for self-emission. In an embodiment, each light source unit may include at least one light emitting element, e.g., at least one light emitting element LD in accordance with one of the embodiments of FIGS. 1A to 3B. In other words, each pixel PXL in accordance with an embodiment may include light emitting elements LD divided into at least two groups. In an embodiment, the light emitting elements LD provided in each pixel PXL may be rod-type light emitting diodes each having a size in a range of the nanoscale to the microscale, but the disclosure is not limited thereto.

In case that a scan signal is supplied to a scan line S, each pixel PXL may receive first and second data signals from corresponding first and second data lines D1 and D2 and may emit light at a luminance corresponding to the first and second data signals. In an embodiment, the first and second data signals may be data signals obtained by applying different gamma values to corresponding pixel data. For example, the first data signal may be a data signal obtained by applying a first gamma value to corresponding pixel data, and the second data signal may be a data signal obtained by applying a second gamma value to the pixel data. In an embodiment, the first and second gamma values may be set such that, in case that each pixel PXL expresses or displays a low gray scale equal to or less than (or less than) a predetermined reference gray scale value, driving current may be blocked from being supplied to at least one of first and second light source units provided in the pixel PXL. In other cases, a predetermined driving current may be supplied to both the first and second light source units.

The scan driver 110 may supply scan signals to the scan lines S in response to a first gate control signal supplied from the timing controller 140. For example, the scan driver 110 may be supplied with a first gate start pulse GSP1 and a first gate shift clock GSC1 from the timing controller 140 and sequentially output, in response thereto, the scan signals to the scan lines S. The pixels PXL may be selected on a horizontal line basis by the scan signals. The selected pixels PXL may be supplied with first and second data signals from the first and second data lines D1 and D2, respectively. In an embodiment, the scan driver 110 may be formed or mounted in the display panel including the pixel unit 100 or may be mounted on a separate circuit board or the like and electrically connected to the display panel through a pad component.

The emission control driver 120 may supply emission control signals to the emission control lines E in response to a second gate control signal supplied from the timing controller 140. For example, the emission control driver 120 may be supplied with a second gate start pulse GSP2 and a second gate shift clock GSC2 from the timing controller 140 and sequentially output, in response thereto, the emission control signals to the emission control lines E.

In an embodiment, each emission control signal may have a predetermined gate-off voltage. Therefore, the pixels PXL supplied with the emission control signal may be controlled not to emit light on a horizontal line basis and may be set to a state of enabling the pixels PXL to emit light during the remaining period in which the supply of the emission control signal is interrupted (i.e., a period in which the emission control signal has a predetermined gate-on voltage). In an embodiment, the emission control driver 120 may be formed or mounted in the display panel or may be mounted on a separate circuit board or the like and electrically connected to the display panel through a pad component. In an embodiment, the emission control driver 120 may be integral with the scan driver 110 or may be formed or mounted separately from the scan driver 110.

The data driver 130 may generate at least one data signal for each pixel PXL in response to frame data DATA and a data control signal supplied from the timing controller 140. For example, the data driver 130 may include j-th first and second channels electrically connected to the first and second data lines D1[j] and D2[j] of a pixel PXL disposed in a j-th column. Therefore, the data driver 130 may supply each first data signal to each first data line D1 and supply each second data signal to each second data line D2. For example, the data driver 130 may supply, in each frame period, first and second data signals respectively to the first and second data lines D1 and D2 in response to frame data DATA, a source start pulse SSP, a source sampling clock SSC, and a source output enable signal SOE which are supplied from the timing controller 140.

In an embodiment, the frame data DATA may include two or more types of converted data obtained by applying different gamma values to each pixel data included in the input image data RGB. For example, the frame data DATA may include first and second converted data DATA1 and DATA2 obtained by respectively applying first and second gamma values to pixel data corresponding to each pixel PXL. The data driver 130 may generate first and second data signals respectively corresponding to the first and second converted data DATA1 and DATA2 and may respectively output the first and second data signals to the first and second data lines D1 and D2 of the corresponding pixel PXL.

The timing controller 140 may control the scan driver 110, the emission control driver 120, and the data driver 130 in response to input image data RGB and timing signals which are supplied from the host system 150. For example, based on input image data RGB and timing signals such as a vertical synchronization signal Vsync, a horizontal synchronous signal Hsync, a data enable signal DE, and a clock signal CLK, the timing controller 140 may supply first and second gate control signals respectively to the scan driver 110 and the emission control driver 120, and may supply frame data DATA and a data control signal to the data driver 130.

In an embodiment, the timing controller 140 may output converted data obtained by applying different gamma values to each pixel data included in the input image data RGB. For example, the timing controller 140 may generate first and second converted data DATA1 and DATA2 by respectively applying first and second digital gamma values to each pixel data and may output, to the data driver 130, frame data DATA including the first and second converted data DATA1 and DATA2 for each of the pixels PXL.

The first gate control signal may include a first gate start pulse GSP1 and one or more first gate shift clock GSC1. The first gate start pulse GSP1 may control a supply timing of a first scan signal. The first gate shift clock GSC1 may refer to one or more clock signals for shifting the first gate start pulse GSP1.

The second gate control signal may include a second gate start pulse GSP2 and one or more second gate shift clock GSC2. The second gate start pulse GSP2 may control a supply timing of a first emission control signal. The second gate shift clock GSC2 may refer to one or more clock signals for shifting the second gate start pulse GSP2.

The data control signal may include a source start pulse SSP, a source sampling clock SSC, a source output enable signal SOE, or the like. The source start pulse SSP may control a data sampling start timing of the data driver 130. The source sampling clock SSC may control a sampling operation of the data driver 130 based on a rising or falling edge. The source output enable signal SOE may control an output timing of the data driver 130.

The host system 150 may supply input image data RGB to the timing controller 140 through a predetermined interface. The host system 150 may supply timing signals (e.g., a vertical synchronization signal Vsync, a horizontal synchronous signal Hsync, a data enable signal DE, and a clock signal CLK) to the timing controller 140.

The gamma voltage generator 160 may generate a gamma voltage Vgam for converting digital frame data DATA to an analog data voltage (e.g., a data signal). For example, if the display device displays 0 to 255 gray scales, the gamma voltage generator 160 may generate gray scale voltages V0 to V255 corresponding to the respective gray scales based on a predetermined gamma value (or gamma curve), e.g., about 2.2 gamma, and may supply the generated gray scale voltages to the data driver 130.

In the display device in accordance with the foregoing embodiment, each pixel PXL may include light source units. For example, each pixel PXL may include first and second light source units, and the pixel PXL may be electrically connected to a pair of first and second data lines D1 and D2. Therefore, the pixel unit 100 may include the number of data lines D, which is twice the number of vertical lines. The data driver 130 may include data channels corresponding to the respective data lines D. For example, if the pixel unit 100 includes pixels PXL disposed in n horizontal lines (where n is a natural number of 2 or greater) and m vertical lines (where m is a natural number of 2 or greater), the pixel unit 100 may be provided with n scan lines S electrically connected to pixels PXL disposed in at least respective horizontal lines, and m first data lines D1 and m second data lines D2 that are electrically connected to pixels PXL disposed in respective vertical lines.

In this case, the data driver 130 may include 2m data channels respectively connected to different data lines D among the m first data lines D1 and the m second data lines D2. The data driver 130 may drive the first light source unit of each pixel PXL by supplying the first data signal to the corresponding first data line D1 and may drive the second light source unit of each pixel PXL by supplying the second data signal to the corresponding second data line D2.

In the display device in accordance with the foregoing embodiment, the data driver 130 and/or the timing controller 140 may control the light source units of the pixels PXL such that in a low gray scale area of a predetermined reference gray scale value or less (or less than the predetermined reference gray scale value), at least some of the light source units of each pixel PXL do not emit light, and in a high gray scale area having a gray scale value greater than the reference gray scale value, all of the light source units of each pixel PXL may emit light. For example, in the case where during each frame period, at least one pixel PXL is required to display a low gray scale of the reference gray scale value or less, the data driver 130 and/or the timing controller 140 may generate a second data signal for blocking driving current from being supplied to the second light source unit of the pixel PXL. In this case, unlike the case where both the first and second light source units are driven to display the same gray scale, a larger amount of driving current may flow to each light emitting element LD of the first light source unit. In accordance with an embodiment, the gray scale may be more precisely displayed even in a low gray scale area.

During each frame period in which at least one pixel PXL displays a gray scale greater than the predetermined gray scale value (or equal to or greater than the predetermined gray scale value), first and second data signals each having a gate-on voltage of a level corresponding to the corresponding gray scale may be supplied to the first and second data lines D1[j] and D2[j], so that both the first and second light source units LSU1 and LSU2 can be driven. Therefore, the light emitting elements LD disposed in each pixel PXL may be efficiently used, so that the pixel PXL may emit light at a desired luminance.

In accordance with the foregoing embodiment, the gray scale can be more precisely displayed even in a low gray scale area. Therefore, the low gray scale expression capability of the pixel PXL including light emitting elements LD and the display device including the pixel PXL may be enhanced. Detailed descriptions of the structures and driving methods of each pixel PXL, the data driver 130, and the timing controller 140 will be made below.

Figure 5:
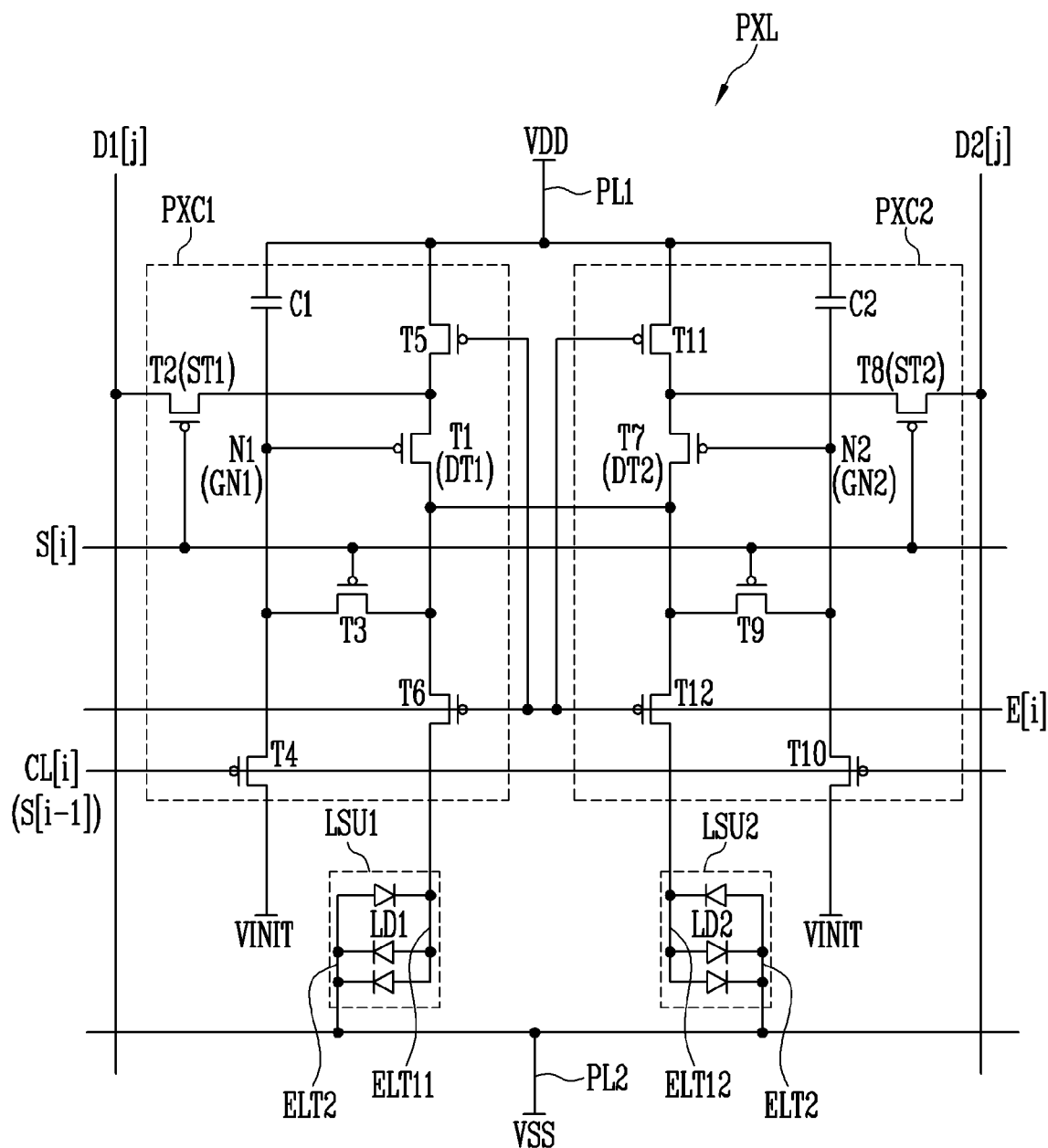
FIG. 5 schematically illustrates a pixel in accordance with an embodiment of the disclosure.

FIG. 5 illustrates a pixel PXL in accordance with an embodiment. For example, FIG. 5 illustrates an embodiment of a pixel PXL which can be provided in the display device of FIG. 4. For the sake of explanation, FIG. 5 illustrates the pixel PXL disposed in an i-th row and a j-th column of the pixel unit 100 illustrated in FIG. 4. In an embodiment, the pixels PXL disposed in the pixel unit 100 may have substantially the same structure, but the disclosure is not limited thereto.

Referring to FIGS. 4 and 5, the pixel PXL in accordance with an embodiment may include first and second light source units LSU1 and LSU2 including respective electrodes obtained by dividing at least one pixel electrode into parts, and first and second driving circuits PXC1 and PXC2 configured to respectively drive the first and second light source units LSU1 and LSU2. For example, a first pixel electrode ELT1 of each pixel PXL may include at least one first split electrode ELT11 disposed in the first light source unit LSU1, and at least one second split electrode ELT12 separated from the first split electrode ELT11 and disposed in the second light source unit LSU2. In an embodiment, the second pixel electrode ELT2 of each pixel PXL may be formed in common in the first and second light source units LSU1 and LSU2, but the disclosure is not limited thereto. For example, the second pixel electrode ELT2 may be connected in common between a second power supply VSS and ends of the first and second light emitting elements LD1 and LD2 of each pixel PXL.

In an embodiment, the first and second light source units LSU1 and LSU2 may form the light source unit LSU of the corresponding pixel PXL. The first and second driving circuits PXC1 and PXC2 may form the pixel circuit PXC of the corresponding pixel PXL.

The first light source unit LSU1 may include at least one first spilt electrode ELT11 electrically connected to a first power supply VDD through the first driving circuit PXC1 and a first power line PL1, a second pixel electrode ELT2 electrically connected to the second power supply VS S through a second power line PL2, and at least one first light emitting element LD1 electrically connected between the first spilt electrode ELT11 and the second pixel electrode ELT2. For example, the first light source unit LSU1 may include first light emitting elements LD1 connected in series and/or parallel to each other between the first split electrode ELT11 and the second pixel electrode ELT2.

In an embodiment, the first power supply VDD and the second power supply VSS may have different potentials. For example, the first power supply VDD may be a high-potential power supply, and the second power supply VSS may be a low-potential power supply. A difference in potential between the first and second power supplies VDD and VSS may be equal to or greater than a threshold voltage of each of the first and second light emitting elements LD1 and LD2.

In an embodiment, at least one first light emitting element LD1 provided in the first light source unit LSU1 may be connected in a forward direction between the first split electrode ELT11 and the second pixel electrode ELT2, broadly, between the first power supply VDD and the second power supply VSS. The at least one first light emitting element LD1 connected in the forward direction may emit light of a luminance corresponding to first driving current in case that the first driving current is supplied from the first driving circuit PXC1 thereto.

The second light source unit LSU2 may include at least one second spilt electrode ELT12 electrically connected to the first power supply VDD through the second driving circuit PXC2 and the first power line PL1, a second pixel electrode ELT2 electrically connected to the second power supply VSS through the second power line PL2, and at least one second light emitting element LD2 electrically connected between the second spilt electrode ELT12 and the second pixel electrode ELT2. For example, the second light source unit LSU2 may include second light emitting elements LD2 connected in series and/or parallel to each other between the second split electrode ELT12 and the second pixel electrode ELT2.

In an embodiment, at least one second light emitting element LD2 provided in the second light source unit LSU2 may be connected in a forward direction between the second split electrode ELT12 and the second pixel electrode ELT2, broadly, between the first power supply VDD and the second power supply VSS. The at least one second light emitting element LD2 electrically connected in the forward direction may emit light at a luminance corresponding to second driving current in case that the second driving current is supplied from the second driving circuit PXC2 thereto.

In an embodiment, the first and second light emitting elements LD1 and LD2 may emit light having the same color. For example, the first and second light emitting elements LD1 and LD2 may emit light having a predetermined color corresponding to a color of a corresponding pixel PXL (or corresponding sub-pixel). However, the disclosure is not limited thereto. For example, in case that a color conversion layer and/or color filter including quantum dots or the like is disposed over each pixel PXL, the first and second light emitting elements LD1 and LD2 may be formed of light emitting elements emitting light having a color different from that of the corresponding pixel PXL (or corresponding sub-pixel) or light emitting elements emitting white light.

Furthermore, the first and second light emitting elements LD1 and LD2 may be of the same type, but the disclosure is not limited thereto. The first and second light emitting elements LD1 and LD2 may have substantially the same or similar size and/or shape, but the disclosure is not limited thereto. For the sake of explanation, hereinafter the term "light emitting element LD" or "light emitting elements LD" will be used to denote a first and/or second light emitting element LD1 and/or LD2 of the first and second light emitting elements LD1 and LD2, or collectively denote the first and second light emitting elements LD1 and LD2.

In an embodiment, each light emitting element LD may be a subminiature light emitting diode. For example, each light emitting element LD may be a rod type light emitting diode having a size ranging from the nanoscale to the microscale. In the disclosure, the type and/or shape of the light emitting elements LD is not particularly limited, and each of the light emitting elements LD may be a self-emissive element having various types and/or shapes.

The first driving circuit PXC1 may be electrically connected between the first power supply VDD and the first split electrode ELT11. Furthermore, the first driving circuit PXC1 may be electrically connected to a scan line S of a corresponding horizontal line, e.g., at least one scan line including an i-th scan line S[i] (hereinafter referred to as "scan line" or "present scan line"), and a first data line D1 of a corresponding vertical line, e.g., a j-th first data line D1[j] (hereinafter referred to as "first data line"). The first driving circuit PXC1 may generate a first driving current in response to a first data signal supplied to the first data line D1[j] and may supply the first driving current to the first light source unit LSU1.

In an embodiment, the first driving circuit PXC1 may include first to sixth transistors T1 to T6 and a first capacitor C1. In an embodiment, the first to sixth transistors T1 to T6 may be of the same type. For example, the first to sixth transistors T1 to T6 may be P-type transistors. However, the disclosure is not limited thereto. For example, in an embodiment, the first to sixth transistors T1 to T6 may be N-type transistors. As another example, some of the first to sixth transistors T1 to T6 may be P-type transistors, and the other transistors may be N-type transistors.

The first transistor T1 may be a driving transistor (also referred to as "first driving transistor DT1") for generating the first driving current and may be electrically connected between the first power supply VDD and the first split electrode ELT11. For example, the first transistor T1 may include a first electrode (e.g., source electrode) electrically connected to the first power supply VDD via the fifth transistor T5 and the first power line PL1, a second electrode (e.g., drain electrode) electrically connected to the first split electrode ELT11 of the first light source unit LSU1 through the sixth transistor T6, and a gate electrode electrically connected to a first node N1 (also referred to as "first gate node GN1"). The first transistor T1 may generate the first driving current in response to the first data signal supplied to the first node N1 via the first data line D1[j].

The second transistor T2 may be electrically connected between the first data line D1[j] and a first electrode of the first transistor T1. A gate electrode of the second transistor T2 may be electrically connected to the scan line S[i]. The second transistor T2 may be turned on in case that a scan signal having a gate-on voltage (also referred to as "present scan signal") is supplied from the scan line S[i] thereto. If the second transistor T2 is turned on, the first data signal supplied to the first data line D1[j] may be transmitted to the first electrode of the first transistor T1. The first data signal transmitted to the first electrode of the first transistor T1 may be transmitted to the first node N1 via the first and third transistors T1 and T3 and stored in the first capacitor C1. In other words, the second transistor T2 may be a switching transistor (also referred to as "first switching transistor ST1") for transmitting the first data signal into the first driving circuit PXC1.

The third transistor T3 may be electrically connected between a second electrode of the first transistor T1 and the first node N1. A gate electrode of the third transistor T3 may be electrically connected to the scan line S[i]. The third transistor T3 may be turned on in case that a scan signal having a gate-on voltage is supplied from the scan line S[i] thereto. In case that the third transistor T3 is turned on, the first transistor T1 may be connected in the form of a diode or be diode-connected.

The fourth transistor T4 may be electrically connected between the first node N1 and an initialization power supply VINIT. A gate electrode of the fourth transistor T4 may be electrically connected to an initialization control line of the corresponding horizontal line, e.g., an i-th initialization control line CL[i] (hereinafter referred to as "initialization control line"). In an embodiment, the initialization control line CL[i] may be one of the scan lines S of previous horizontal lines. For example, the i-th initialization control line CL[i] may be a present scan line of an immediately previous horizontal line, i.e., an i–1-th scan line S[i–1] (also referred to as "previous scan line"). However, the disclosure is not limited thereto. For example, in an embodiment, initialization control lines separated from the scan lines S may be provided. The fourth transistor T4 may be turned on in case that an initialization control signal having a gate-on voltage (e.g., a previous scan signal having a gate-on voltage) is supplied to the initialization control line CL[i]. If the fourth transistor T4 is turned on, the first node N1 may be initialized to the voltage of the initialization power supply VINIT. In an embodiment, the voltage of the initialization power supply VINIT may be a voltage equal to or less than the minimum voltage of the first data signal. For example, the voltage of the initialization power supply VINIT may be a voltage lower than the minimum voltage of the first data signal by equal to or greater than the threshold voltage of the first transistor T1. Therefore, during each frame period, the first data signal may be reliably transmitted to the first node N1 regardless of the voltage of the first data signal supplied during a previous frame period.

The fifth transistor T5 may be electrically connected between the first power supply VDD and the first electrode of the first transistor T1. A gate electrode of the fifth transistor T5 may be electrically connected to an emission control line of the corresponding horizontal line, e.g., an i-th emission control line E[i] (hereinafter referred to as "emission control line"). The fifth transistor T5 may be turned off in case that an emission control signal having a gate-off voltage is supplied to the emission control line E[i] and may be turned on in other cases (e.g., in case that the voltage of the emission control signal is a gate-on voltage). If the fifth transistor T5 is turned off, connection between the first power supply VDD and the first transistor T1 may be interrupted. If the fifth transistor T5 is turned on, the first transistor T1 may be electrically connected to the first power supply VDD.

The sixth transistor T6 may be electrically connected between the second electrode of the first transistor T1 and the first split electrode ELT11. A gate electrode of the sixth transistor T6 may be electrically connected to the emission control line E[i]. The sixth transistor T6 may be turned off in case that an emission control signal having a gate-off voltage is supplied to the emission control line E[i] and may be turned on in the other cases. If the sixth transistor T6 is turned off, connection between the first transistor T1 and the first light source unit LSU1 (e.g., the first split electrode ELT11 of the first light source unit LSU1) may be interrupted. If the sixth transistor T6 is turned on, the first light source unit LSU1 may be connected to the first transistor T1, so that the first driving current may be supplied from the first transistor T1 to the first light source unit LSU.

The first capacitor C1 may be electrically connected between the first power supply VDD and the first node N1. The first capacitor C1 may store a voltage corresponding to a first data signal transmitted to the first node N1 and the threshold voltage of the first transistor T1 in each frame period (particularly, a data write period of each frame).

The configuration of the first driving circuit PXC1 is not limited to that of the embodiment illustrated in FIG. 5. For example, the first driving circuit PXC1 may have configurations corresponding to various known pixel circuit structures.

The second driving circuit PXC2 may be electrically connected between the first power supply VDD and the second split electrode ELT12. Furthermore, the second driving circuit PXC2 may be electrically connected to a scan line S of a corresponding horizontal line, e.g., at least one scan line including an i-th scan line S[i] (hereinafter referred to as "scan line" or "present scan line"), and a second data line D2 of a corresponding vertical line, e.g., a j-th second data line D2[j] (hereinafter referred to as "second data line"). The second driving circuit PXC2 may generate a second driving current in response to a second data signal supplied to the second data line D2[j] and may supply the second driving current to the second light source unit LSU2.

In an embodiment, the second driving circuit PXC2 may include seventh to twelfth transistors T7 to T12 and a second capacitor C2. In an embodiment, the seventh to twelfth transistors T7 to T12 may be of the same type. For example, the seventh to twelfth transistors T7 to T12 may be P-type transistors. However, the disclosure is not limited thereto. For example, in an embodiment, the seventh to twelfth transistors T7 to T12 may be N-type transistors. As another example, some of the seventh to twelfth transistors T7 to T12 may be P-type transistors, and the other transistors may be N-type transistors.

The seventh transistor T7 may be a driving transistor (also referred to as "second driving transistor DT2") for generating the second driving current and may be electrically connected between the first power supply VDD and the second split electrode ELT12. For example, the seventh transistor T7 may include a first electrode (e.g., a source electrode) electrically connected to the first power supply VDD via the eleventh transistor T11 and the first power line PL1, a second electrode (e.g., a drain electrode) electrically connected to the second split electrode ELT12 of the second light source unit LSU2 through the twelfth transistor T12, and a gate electrode electrically connected to the second node N2 (also referred to as "second gate node GN2"). The seventh transistor T7 may generate the second driving current in response to the second data signal supplied to the second node N2 via the second data line D2[j].

The eighth transistor T8 may be electrically connected between the second data line D2[j] and the first electrode of the seventh transistor T7. A gate electrode of the eighth transistor T8 may be electrically connected to the scan line S[i]. The eighth transistor T8 may be turned on in case that a scan signal having a gate-on voltage is supplied from the scan line S[i] thereto. If the eighth transistor T8 is turned on, the second data signal supplied to the second data line D2[j] may be transmitted to the first electrode of the seventh transistor T7. The second data signal transmitted to the first electrode of the seventh transistor T7 may be transmitted to the second node N2 via the seventh and ninth transistors T7 and T9 and may be stored in the second capacitor C2. In other words, the eighth transistor T8 may be a switching transistor (also referred to as "second switching transistor ST2") for transmitting the second data signal to the second driving circuit PXC2.

The ninth transistor T9 may be electrically connected between the second electrode of the seventh transistor T7 and the second node N2. A gate electrode of the ninth transistor T9 may be electrically connected to the scan line S[i]. The ninth transistor T9 may be turned on in case that a scan signal having a gate-on voltage is supplied from the scan line S[i] thereto. In case that the ninth transistor T9 is turned on, the seventh transistor T7 may be electrically connected in the form of a diode or be diode-connected.

The tenth transistor T10 may be electrically connected between the second node N2 and the initialization power supply VINIT. A gate electrode of the tenth transistor T10 may be electrically connected to the initialization control line CL[i]. The tenth transistor T10 may be turned on in case that an initialization control signal having a gate-on voltage is supplied to the initialization control line CL[i]. If the tenth transistor T10 is turned on, the second node N2 may be initialized to the voltage of the initialization power supply VINIT. In an embodiment, the voltage of the initialization power supply VINIT may be equal to or less than the minimum voltage of the second data signal. For example, the voltage of the initialization power supply VINIT may be lower than the minimum voltage of the second data signal by equal to or greater than the threshold voltage of the seventh transistor T7. Therefore, during each frame period, the second data signal may be reliably transmitted to the second node N2 regardless of the voltage of the second data signal supplied during a previous frame period.

The eleventh transistor T11 may be electrically connected between the first power supply VDD and the first electrode of the seventh transistor T7. A gate electrode of the eleventh transistor T11 may be electrically connected to the emission control line E[i]. The eleventh transistor T11 may be turned off in case that an emission control signal having a gate-off voltage is supplied to the emission control line E[i] and may be turned on in the other cases. If the eleventh transistor T11 is turned off, connection between the first power supply VDD and the seventh transistor T7 may be interrupted. If the eleventh transistor T11 is turned on, the seventh transistor T7 may be electrically connected to the first power supply VDD.

The twelfth transistor T12 may be electrically connected between the second electrode of the seventh transistor T7 and the second split electrode ELT12. A gate electrode of the twelfth transistor T12 may be electrically connected to the emission control line E[i]. The twelfth transistor T12 may be turned off in case that an emission control signal having a gate-off voltage is supplied to the emission control line E[i] and may be turned on in other cases. If the twelfth transistor T12 is turned off, connection between the seventh transistor T7 and the second light source unit LSU2 (e.g., the second split electrode ELT12 of the second light source unit LSU2) may be interrupted. If the twelfth transistor T12 is turned on, the second light source unit LSU2 may be electrically connected to the seventh transistor T7, so that the second driving current may be supplied from the seventh transistor T7 to the second light source unit LSU2.

The second capacitor C2 may be electrically connected between the first power supply VDD and the second node N2. The second capacitor C2 may store a voltage corresponding to a second data signal transmitted to the second node N2 and the threshold voltage of the seventh transistor T7 in each frame period (particularly, a data write period of each frame).

The configuration of the second driving circuit PXC2 is not limited to that of the embodiment illustrated in FIG. 5. For example, the second driving circuit PXC2 may have configurations corresponding to various known pixel circuit structures.

The pixel PXL according to the foregoing embodiment may include light source units LSU electrically connected to different split electrodes. For example, the pixel PXL may include the first and second light source units LSU1 and LSU2 respectively and separately connected to the first and second split electrodes ELT11 and ELT12. Furthermore, the pixel PXL may further include the first and second driving circuits PXC1 and PXC2 that are respectively connected to the first and second data lines D1[j] and D2[j] and configured to drive the first and second light source units LSU1 and LSU2 in response to first and second data signals supplied from the first and second data lines D1[j] and D2[j].

In accordance with the above-described embodiment, the first and second light source units LSU1 and LSU2 may be individually driven in each frame period by controlling the first and second data signals to be supplied to the first and second data lines D1[j] and D2[j]. In an embodiment, with regard to a pixel PXL required to display a low gray scale of a predetermined gray scale or less during each frame period, the second driving current may be blocked from flowing to the second light source unit LSU2 by supplying a second data signal having a gate-off voltage during the corresponding frame period, and only the first light source unit LSU1 may emit light by supplying a first data signal having a predetermined gate-on voltage for displaying the corresponding gray scale (or a gate-off voltage in the case of a black gray scale). Therefore, the corresponding gray scale may be displayed. In this case, unlike an embodiment in which the first and second light source units LSU1 and LSU2 are driven to display the same gray scale, a larger amount of current may flow to each first light emitting element LD1 (particularly, each valid light emitting element connected in a forward direction between the first split electrode ELT11 and the second pixel electrode ELT2).

In accordance with an embodiment, light emitting elements LD provided in each pixel PXL may be divided into at least two groups (e.g., the first and second light source units LSU1 and LSU2), and in a low gray scale area corresponding to a value of a predetermined gray scale or less, some of the light emitting elements LD (e.g., at least one first light emitting element LD1 connected in the forward direction in the first light source unit LSU1) may be selectively driven. Therefore, the amount of current flowing to each first light emitting element LD1 may be increased.

Therefore, according to the foregoing embodiment, with regard to the pixel PXL including light emitting elements LD and the display device including the pixel PXL, the light emitting elements LD of each pixel PXL may be divided into groups and driven in groups. Therefore, difficulties in fine current control may be overcome, and the gray scale may be more precisely displayed even in a low gray scale area.

Figure 6:
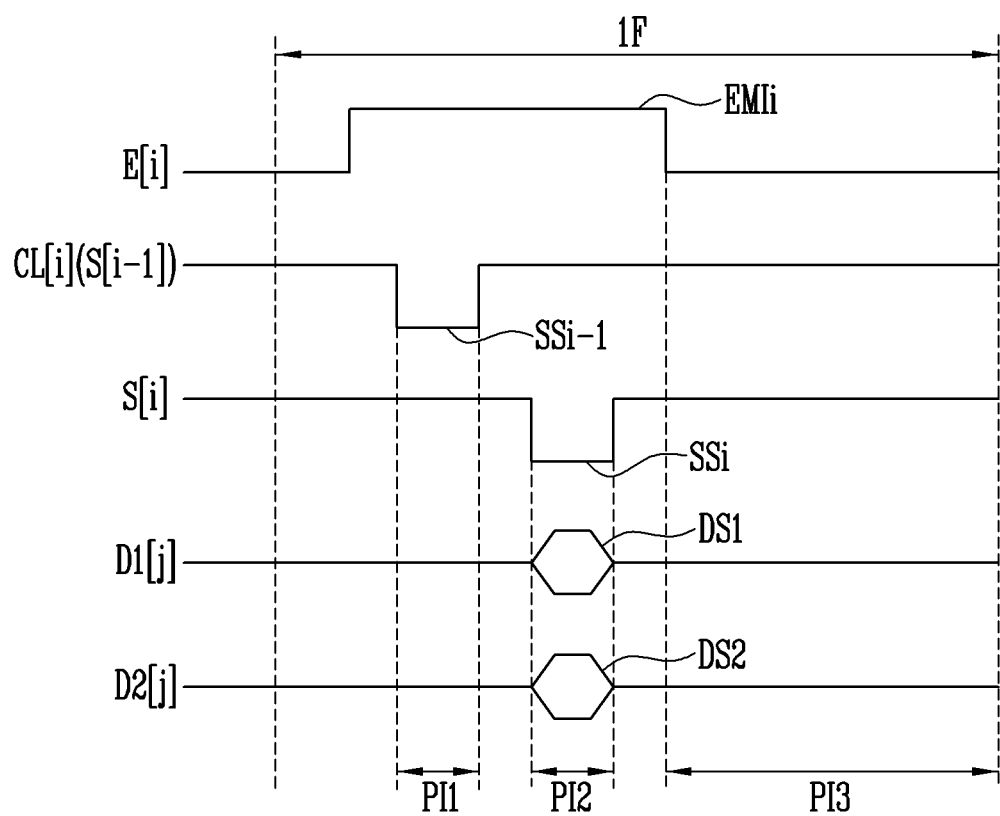
FIG. 6 schematically illustrates an embodiment of a method of driving the pixel illustrated in FIG. 5.

FIG. 6 illustrates an embodiment of a method of driving the pixel PXL illustrated in FIG. 5. Hereinafter, a method of driving the pixel PXL shown in FIG. 5 will be described with reference to FIG. 6 along with FIG. 5.

Referring to FIGS. 5 and 6, during a frame period 1F, an emission control signal EMIi having a gate-off voltage may be supplied to the emission control line E[i]. During a period in which the emission control signal EMIi is supplied, the fifth, sixth, eleventh, and twelfth transistors T5, T6, T11, and T12 may remain turned off.

During a period in which the emission control signal EMIi having a gate-off voltage is supplied, a previous scan signal SSi−1 and a present scan signal SSi may be respectively and sequentially supplied to the initialization control line CL[i], e.g., a previous scan line S[i−1] as the initialization control line CL[i], and the present scan line S[i]. The previous scan signal SSi−1 and the present scan signal SSi each may have a gate-on voltage.

During a first period PI1 in which the previous scan signal SSi−1 having a gate-on voltage is supplied, the pixel PXL may be initialized. For example, if the previous scan signal SSi−1 is supplied, the fourth and tenth transistor T4 and T10 may be turned on, and the voltage of the initialization power supply VINIT may be transmitted to the first and second nodes N1 and N2. Therefore, the voltage stored in the first and second capacitors C1 and C2 during the previous frame period, and the gate voltages of the first and seventh transistors T1 and T7 may be initialized by the voltage of the initialization power supply VINIT. Furthermore, the voltage of the initialization power supply VINIT may be set to the minimum voltage of the first and second data signals or less, so that if the voltage of the initialization power supply VINIT is transmitted to the first and second nodes N1 and N2, the first and seventh transistors T1 and T7 may be turned on.

During a second period PI2 in which the present scan signal SSi having a gate-on voltage is supplied, first and second data signals DS1 and DS2 which are respectively supplied through the first and second data lines D1[j] and D2[j] may be transmitted into the pixel PXL. For example, if the present scan signal SSi is supplied, the second, third, eighth, and ninth transistors T2, T3, T8, and T9 may be turned on.

If the second and third transistors T2 and T3 are turned on, the first data signal DS1 supplied to the first data line D1[j] may be transmitted to the first node N1 sequentially via the second, first, and third transistors T2, T1, and T3. Here, since the first transistor T1 is electrically connected in the form of a diode by the third transistor T3, a voltage corresponding to the first data signal DS1 and the threshold voltage of the first transistor T1 (e.g., a voltage corresponding to a difference between the first data signal DS1 and the threshold voltage of the first transistor T1) may be transmitted to the first node N1. In this case, the voltage transmitted to the first node N1 may be stored in the first capacitor C1. For example, a voltage corresponding to a difference between the first power supply VDD and the voltage of the first node N1 may be stored in the first capacitor C1.

If the eighth and ninth transistors T8 and T9 are turned on, the second data signal DS2 supplied to the second data line D2[j] may be transmitted to the second node N2 sequentially via the eighth, seventh, and ninth transistors T8, T7, and T9. Here, since the seventh transistor T7 is electrically connected in the form of a diode by the ninth transistor T9, a voltage corresponding to the second data signal DS2 and the threshold voltage of the seventh transistor T7 (e.g., a voltage corresponding to a difference between the second data signal DS2 and the threshold voltage of the seventh transistor T7) may be transmitted to the second node N2. In this case, the voltage transmitted to the second node N2 may be stored in the second capacitor C2. For example, a voltage corresponding to a difference between the first power supply VDD and the voltage of the second node N2 may be stored in the second capacitor C2.

After the initialization step and the step of charging the first and second data signals DS1 and DS2 have been completed, the supply of the emission control signal EMIi having a gate-off voltage may be interrupted. During a third period PI3, the voltage of the emission control signal EMIi may be maintained at the gate-on voltage. Therefore, the fifth, sixth, eleventh, and twelfth transistors T5, T6, T11, and T12 may be turned on, so that the pixel PXL may emit light of a luminance corresponding to the first and second data signals DS1 and DS2 (and may not emit light in the case where first and second data signals DS1 and DS2 corresponding to the black gray scale are supplied).

In detail, if the fifth and sixth transistors T5 and T6 are turned on, current may flow between the first power supply VDD and the second power supply VSS via the fifth, first, and sixth transistors T5, T1, and T6, and the first light source unit LSU1. During the third period PI3, the first transistor T1 may generate first driving current corresponding to the voltage of the first node N1. Here, since the threshold voltage of the first transistor T1 has been stored along with the voltage of the first data signal DS1 during the second period PI2, the threshold voltage of the first transistor T1 may be offset during the third period PI3, so that the first driving current corresponding to the voltage of the first data signal DS1 may flow to the first light source unit LSU1 regardless of the threshold voltage of the first transistor T1.

If the eleventh and twelfth transistors T11 and T12 are turned on, current may flow between the first power supply VDD and the second power supply VSS via the eleventh, seventh, and twelfth transistors T11, T7, and T12, and the second light source unit LSU2. During the third period PI3, the seventh transistor T7 may generate second driving current corresponding to the voltage of the second node N2. Here, since the threshold voltage of the seventh transistor T7 has been stored along with the voltage of the second data signal DS2 during the second period PI2, the threshold voltage of the seventh transistor T7 may be offset during the third period PI3, so that the second driving current corresponding to the voltage of the second data signal DS2 may flow to the second light source unit LSU2 regardless of the threshold voltage of the seventh transistor T7. In other words, the threshold voltages of the first and seventh transistors T1 and T7 may be offset, so that each pixel PXL may emit light of a uniform luminance in response to the first and second data signals DS1 and DS2. Therefore, the pixel unit 100 may display an image having uniform image quality.

The pixel PXL according to the foregoing embodiment may emit light corresponding to the sum of light emitted from the first and second light source units LSU1 and LSU2 respectively in response to the first and second data signals DS1 and DS2. In an embodiment, the first and second data signals DS1 and DS2 may be data signals to which different gamma values are applied. For example, the first and second data signals DS1 and DS2 may be data signals to which different digital gamma values and/or different gamma voltages are applied. Therefore, the first and second light source units LSU1 and LSU2 may show different luminance characteristics in response to respective pieces of pixel data (e.g., respective pieces of gray scale data). The pixel PXL may show luminance characteristics combined with luminance characteristics of the first and second light source units LSU1 and LSU2.

In the foregoing embodiment, in case that the first data signal DS1 is generated by applying the first gamma value (or first gamma curve) and the second data signal DS2 is generated by applying the second gamma value (or second gamma curve), the light source units can be controlled such that only some of the light source units, e.g., only the first light source unit LSU1, is driven by adjusting the first and second gamma values in a low gray scale area corresponding to a predetermined gray scale value or less. Furthermore, the first and second gamma values may be controlled to correspond to desired gamma characteristics to be eventually displayed by the pixel PXL.

In accordance with the foregoing embodiment, the pixel PXL may be configured to display desired gamma characteristics and may be also controlled such that in a low gray scale area corresponding to a predetermined gray scale value or less, only some of light source units, e.g., only the first light source unit LSU1, may be driven. Therefore, the low gray scale expression capability of the pixel PXL including light emitting elements LD and the display device including the pixel PXL may be enhanced.

Figure 7:
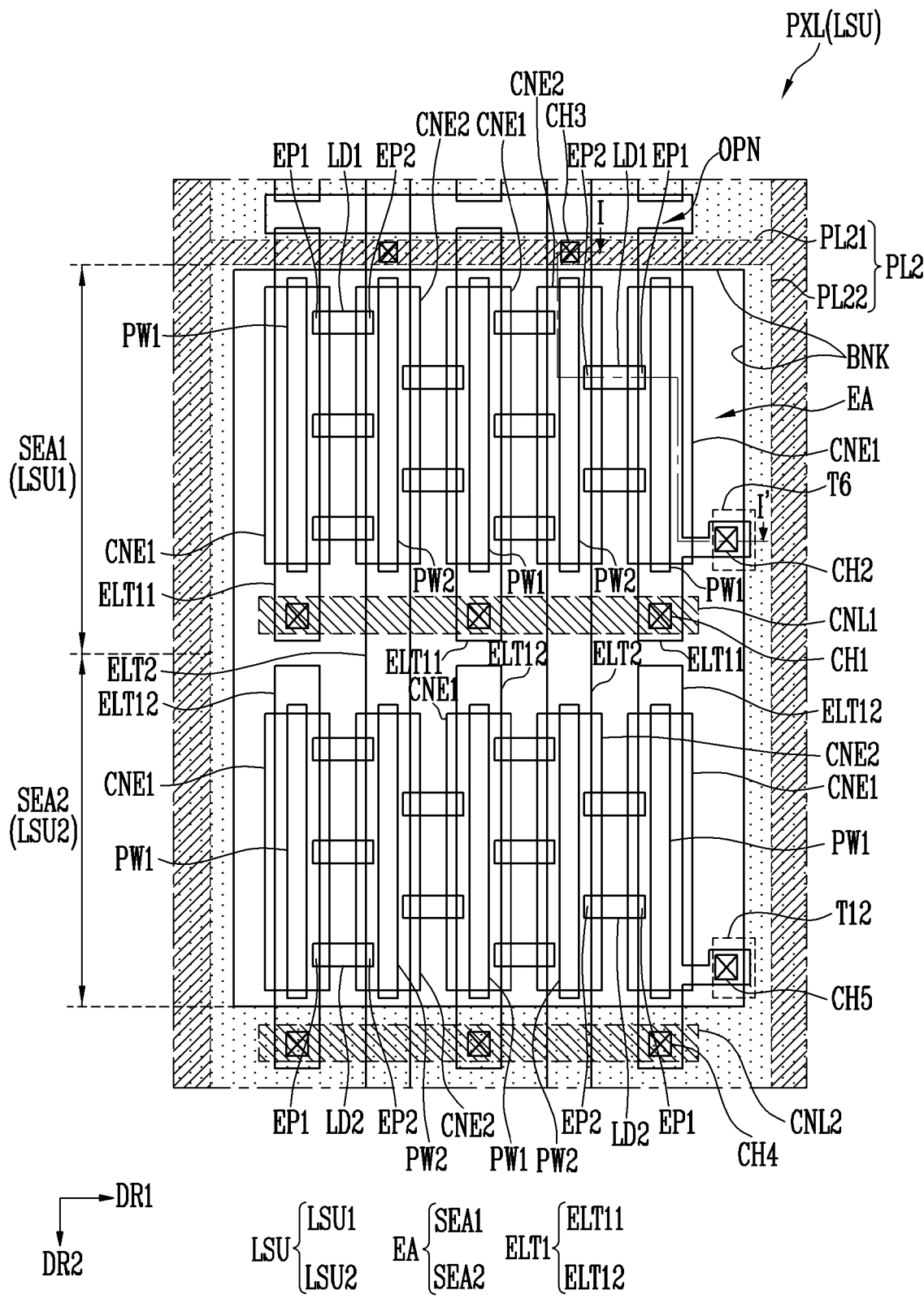
FIG. 7 schematically illustrates an embodiment of a light source unit of the pixel illustrated in FIG. 5.

FIG. 7 illustrates an embodiment of the light source unit LSU of the pixel PXL illustrated in FIG. 5. For the sake of explanation, FIG. 7 illustrates only a display element layer on which the first and second light source units LSU1 and LSU2 are disposed, but each pixel PXL may further include circuit elements (e.g., circuit elements that form the first and second driving circuit PXC1 and PXC2 of FIG. 5) for controlling the first and second light source units LSU1 and LSU2. Although the circuit elements may be disposed on a pixel circuit layer or the like disposed under the display element layer, the positions of the circuit elements are not limited thereto.

Referring to FIGS. 5 and 7, the pixel PXL in accordance with an embodiment may include an emission area EA including first and second sub-emission areas SEA1 and SEA2, and first and second light source units LSU1 and LSU2 including first and second light emitting elements LD1 and LD2 respectively disposed in the first and second sub-emission area SEA1 and SEA1.

The first and second sub-emission areas SEA1 and SEA2 may be formed by dividing the emission area EA of each pixel PXL and may be enclosed by a bank BNK. In an embodiment, the bank BNK may be a structure for defining the emission area EA of each pixel PXL and may include at least one opaque material to prevent light leakage between adjacent pixels PXL. For example, the bank BNK may be a pixel defining layer disposed between the pixels PXL to enclose the emission area EA of each pixel PXL. In other words, the bank BNK may be disposed around each emission area EA. Furthermore, in an embodiment, the bank BNK may include, in a peripheral area of each emission area EA, an opening OPN which exposes an area of the first and/or second pixel electrode ELT1 and/or ELT2. Therefore, in the step of fabricating the display device, after the first and second light emitting elements LD1 and LD2 are aligned by applying predetermined alignment signals through the first and second pixel electrodes ELT1 and ELT2, the pixels PXL may be separated from each other by disconnecting at least one of the first and second pixel electrodes ELT1 and ELT2 (e.g., the first pixel electrode ELT1) in a boundary area between the pixels PXL so that the pixels PXL can be individually driven.

The first light source unit LSU1 may be disposed and/or configured in the first sub-emission area SEA1. The first light source unit LSU1 may include at least one first split electrode ELT11 and a second pixel electrode ELT2 which are disposed in the first sub-emission area SEA1, and at least one first light emitting element LD1 electrically connected between the first split electrode ELT11 and the second pixel electrode ELT2. For example, the first light source unit LSU1 may include at least one first split electrode ELT11 and a second pixel electrode ELT2 which are disposed in each first sub-emission area SEA1 at positions spaced apart from each other, and first light emitting elements LD1 connected in parallel between the first split electrode ELT11 and the second pixel electrode ELT2. At least one of the first light emitting elements LD1 may be a valid light emitting element connected in a forward direction between the first split electrode ELT11 and the second pixel electrode ELT2.

In an embodiment, first split electrodes ELT11 spaced apart from each other may be disposed in the first sub-emission area SEA1. For example, the first split electrodes ELT11 which are spaced apart from each other by a predetermined distance in the first direction DR1 and each of which has a bar shape extending in the second direction DR2 may be disposed in the first sub-emission area SEA1. In an embodiment, the first split electrodes ELT11 may be electrically connected to each other. For example, the first split electrodes ELT11 may be electrically connected to each other by at least one first contact hole CH1 and a first connection electrode CNL1 extending in the first direction DR1 and intersecting the first split electrodes ELT11. However, the shape and/or connection relationship of the first split electrodes ELT11 is not limited thereto. For example, in an embodiment, the first split electrodes ELT11 may be integral with each other without using a separate first connection electrode CNL1 or the like. In this case, the first split electrodes ELT11 may be regarded as a single first split electrode ELT11. In the case where the first split electrodes ELT11 physically separated from each other are electrically connected to each other, the first split electrodes ELT11 may be regarded as a single first split electrode ELT11.

In an embodiment, the first split electrodes ELT11 may be electrically connected to first ends EP1 of the first light emitting elements LD1. For example, the first split electrodes ELT11 may directly contact and/or be directly connected to the first ends EP1 of the first light emitting elements LD1 or may be electrically connected to the first ends EP1 of the first light emitting elements LD1 through at least one first contact electrode CNE1.

Furthermore, the first split electrodes ELT11 may be electrically connected to at least one circuit element which forms the first driving circuit PXC1 of the corresponding pixel PXL. For example, the first split electrodes ELT11 may be electrically connected to the sixth transistor T6 through a second contact hole CH2.

However, the disclosure is not limited thereto. For example, in an embodiment, the first split electrodes ELT11 may be electrically connected to the second power supply VSS through the second contact hole CH2, and at least one second pixel electrode ELT2 may be electrically connected to the sixth transistor T6 or the like through a third contact hole CH3. In an embodiment, one of the first split electrodes ELT11 and the second pixel electrode ELT2 may be directly connected to the first power line PL1, the second power line PL2, the scan line S[i], or the first data line D1[j] without passing through a contact hole, a circuit element, or the like.

Each first split electrode ELT11 may be disposed to face at least one second pixel electrode ELT2. At least one first light emitting element LD1 may be electrically connected between each first split electrode ELT11 and the second pixel electrode ELT2. In an embodiment, the orientation of each of the first light emitting elements LD1 is not particularly limited. Furthermore, the first light emitting elements LD1 may be electrically connected in series and/or parallel between the first split electrode ELT11 and the second pixel electrode ELT2.

In an embodiment, at least one second pixel electrode ELT2 spaced apart from the first split electrodes ELT11 may be disposed in the first sub-emission area SEA1. For example, second pixel electrodes ELT2 which are spaced apart from each other by a predetermined distance in the first direction DR1 and each of which has a bar shape extending in the second direction DR2 may be disposed in the first sub-emission area SEA1. In an embodiment, the second pixel electrodes ELT2 may be electrically connected to each other. For example, the second pixel electrodes ELT2 may be electrically connected, through at least one third contact hole CH3, to the second power line PL2 disposed therebelow. For example, the second pixel electrodes ELT2 may be electrically connected, through third contact holes CH3, to the second power line PL2 that is disposed in a mesh shape on the pixel circuit layer provided under the second pixel electrodes ELT2. In an embodiment, the second power line PL2 may include a first directional line PL21 and a second direction line PL22 which respectively extend in the first and second directions DR1 and DR2. The first directional line PL21 may intersect the second pixel electrodes ELT2.

However, the shape and/or connection relationship of the second pixel electrodes ELT2 is not limited thereto. For example, in an embodiment, the second pixel electrodes ELT2 of each pixel PXL may be integral with each other. In this case, the second pixel electrodes ELT2 may be regarded as a single second pixel electrode ELT2.

In an embodiment, at least one second pixel electrode ELT2 may be formed in common in the first and second sub-emission areas SEA1 and SEA2. For example, each second pixel electrode ELT2 may integrally extend in the second direction DR2 without being disconnected in the boundary between the first and second sub-emission areas SEA1 and SEA2.

In an embodiment, the second pixel electrodes ELT2 may be electrically connected to second ends EP2 of the first light emitting elements LD1. For example, the second pixel electrodes ELT2 may directly contact and/or be directly connected to the second ends EP2 of the first light emitting elements LD1 or may be electrically connected to the second ends EP2 of the first light emitting elements LD1 through at least one second contact electrode CNE2.

Furthermore, the second pixel electrodes ELT2 may be electrically connected to the second power supply VSS. For example, the second pixel electrodes ELT2 may be electrically connected to the second power supply VSS through the third contact hole CH3 and the second power line PL2.

Each of the first light emitting elements LD1 may be a light emitting diode which is made of material having an inorganic crystal structure and has a subminiature size, e.g., ranging from the nanoscale to the microscale. For instance, each first light emitting element LD1 may be a subminiature rod-type light emitting diode according to one of the embodiments of FIGS. 1A to 3B.

In an embodiment, at least one contact electrode may be electrically connected to each of the opposite ends of the first light emitting elements LD1. For example, at least one first contact electrode CNE1 may be electrically connected to the first end EP1 of each of the first light emitting elements LD1, and at least one second contact electrode CNE2 may be electrically connected to the second end EP2 of each of the first light emitting elements LD1.

The second light source unit LSU2 may be disposed and/or configured in the second sub-emission area SEA2. The second light source unit LSU2 may include at least one second split electrode ELT12 and a second pixel electrode ELT2 which are disposed in the second sub-emission area SEA2, and at least one second light emitting element LD2 electrically connected between the second split electrode ELT12 and the second pixel electrode ELT2. For example, the second light source unit LSU2 may include a second split electrode ELT12 and a second pixel electrode ELT2 which are disposed in each second sub-emission area SEA2 at positions spaced apart from each other, and second light emitting elements LD2 electrically connected in parallel between the second split electrode ELT12 and the second pixel electrode ELT2. At least one of the second light emitting elements LD2 may be a valid light emitting element connected in a forward direction between the second split electrode ELT12 and the second pixel electrode ELT2.

In an embodiment, second split electrodes ELT12 spaced apart from each other may be disposed in the second sub-emission area SEA2. For example, the second split electrodes ELT12 which are spaced apart from each other by a predetermined distance in the first direction DR1 and each of which has a bar shape extending in the first direction DR1 may be disposed in the second sub-emission area SEA2. In an embodiment, the second split electrodes ELT12 may be electrically connected to each other. For example, the second split electrodes ELT12 may be electrically connected to each other by at least one fourth contact hole CH4 and a second connection electrode CNL2 extending in the first direction DR1 and intersecting the second split electrodes ELT12.

However, the shape and/or connection relationship of the second split electrodes ELT12 is not limited thereto. For example, in an embodiment, the second split electrodes ELT12 may be integral with each other without using a separate second connection electrode CNL2 or the like. In this case, the second split electrodes ELT12 may be regarded as a single second split electrode ELT12. In the case where the second split electrodes ELT12 physically separated from each other are electrically connected to each other, the second split electrodes ELT12 may also be regarded as a single second split electrode ELT12.

In an embodiment, the second split electrodes ELT12 may be connected to first ends EP1 of the second light emitting elements LD2. For example, the second split electrodes ELT12 may directly contact and/or directly connected to the first ends EP1 of the second light emitting elements LD2 or may be electrically connected to the first ends EP1 of the second light emitting elements LD2 through at least one first contact electrode CNE1.

Furthermore, the second split electrodes ELT12 may be electrically connected to at least one circuit element which forms the second driving circuit PXC2 of the corresponding pixel PXL. For example, the second split electrodes ELT12 may be electrically connected to the twelfth transistor T12 through a fifth contact hole CH5.

However, the disclosure is not limited thereto. For example, in an embodiment, the second split electrodes ELT12 may be electrically connected to the second power supply VSS through the fifth contact hole CH5, and at least one second pixel electrode ELT2 may be electrically connected to the twelfth transistor T12 or the like through at least one contact hole. In an embodiment, one of the second split electrodes ELT12 and the second pixel electrode ELT2 may be directly connected to the first power line PL1, the second power line PL2, the scan line S[i], or the second data line D2[j] without passing through a contact hole, a circuit element, or the like.

Each second split electrode ELT12 may face at least one second pixel electrode ELT2. At least one second light emitting element LD2 may be electrically connected between each second split electrode ELT12 and the second pixel electrode ELT2. In an embodiment, the orientation of each of the second light emitting elements LD2 is not particularly limited. Furthermore, the second light emitting elements LD2 may be electrically connected in series and/or parallel between the second split electrode ELT12 and the second pixel electrode ELT2.

In an embodiment, at least one second pixel electrode ELT2 spaced apart from the second split electrodes ELT12 may be disposed in the second sub-emission area SEA2. For example, second pixel electrodes LET2 each of which has a bar shape and is integral with the corresponding second pixel electrode ELT2 disposed in the first sub-emission area SEA1 may be disposed in the second sub-emission area SEA2.

In an embodiment, the second pixel electrodes ELT2 may be electrically connected to second ends EP2 of the second light emitting elements LD2. For example, the second pixel electrodes ELT2 may directly contact and/or directly connected to the second ends EP2 of the second light emitting elements LD2 or may be electrically connected to the second ends EP2 of the second light emitting elements LD2 through at least one second contact electrode CNE2.

Each of the second light emitting elements LD2 may be made of material having an inorganic crystal structure and have a subminiature size, e.g., ranging from the nanoscale to the microscale. For instance, each second light emitting element LD2 may be a subminiature rod-type light emitting diode according to one of the embodiments of FIGS. 1A to 3B.

In an embodiment, at least one contact electrode may be electrically connected to each of the opposite ends of the second light emitting elements LD2. For example, at least one first contact electrode CNE1 may be electrically connected to the first end EP1 of each of the second light emitting elements LD2, and at least one second contact electrode CNE2 may be electrically connected to the second end EP2 of each of the second light emitting elements LD2.

In an embodiment, the first and second light emitting elements LD1 and LD2 (hereinafter collectively referred to as "light emitting elements LD") may be prepared in a diffused form in a predetermined solution (hereinafter referred to as "LED solution" or "LED ink") and may then be supplied to each pixel area by an inkjet method or the like. For example, the light emitting elements LD may be mixed with a volatile solvent and supplied to the emission area EA of each pixel PXL. Here, if a predetermined voltage (or also referred to as "alignment voltage") is applied to the second pixel electrode ELT2 and the first pixel electrode ELT1 including the first and second split electrodes ELT11 and ELT12 (or the first pixel electrode ELT1 that is in an integral state before being divided into the first and second split electrodes ELT11 and ELT12), an electric field may be formed between the first pixel electrode ELT1 and the second pixel electrode ELT2, so that the light emitting elements LD may be self-aligned therebetween. After the light emitting elements LD have been aligned, the solvent may be removed by a volatilization method or other schemes. In this way, the light emitting elements LD may be reliably arranged between the first and second pixel electrodes ELT1 and ELT2.

In an embodiment, at least one first partition wall PW1 (also referred to as "first wall" or "first bank") may be disposed under each of the first and second split electrodes ELT11 and ELT12. In an embodiment, the first partition walls PW1 may overlap respective areas of the first and second split electrodes ELT11 and ELT12 such that the respective areas of the first and second split electrodes ELT11 and ELT12 protrude upward. Therefore, light emitted from the first ends EP1 of the first and second light emitting elements LD1 and LD2 may be guided in the frontal direction of the display device.

Likewise, at least one second partition wall PW2 (also referred to as "second wall" or "second bank") may be disposed under each of the second pixel electrodes ELT2. In an embodiment, the second partition walls PW2 may overlap respective areas of the second pixel electrodes ELT2 such that the respective areas of the second pixel electrodes ELT2 protrude upward. Therefore, light emitted from the second ends EP2 of the first and second light emitting elements LD1 and LD2 may be guided in the frontal direction of the display device.

In an embodiment, at least one first contact electrode CNE1 may be disposed over each of the first and second split electrodes ELT11 and ELT12 and on the first ends EP1 of the first and second light emitting elements LD1 and LD2. Likewise, at least one second contact electrode CNE2 may be disposed over each of the second pixel electrodes ELT2 and on the second ends EP2 of the first and second light emitting elements LD1 and LD2.

Each of the first and second contact electrodes CNE1 and CNE2 may contact and/or be electrically connected to one of the first and second pixel electrodes ELT1 and ELT2 and an end of at least one of the light emitting elements LD. For example, each first contact electrode CNE1 may cover or overlap the first end EP1 of at least one first or second light emitting element LD1 or LD2 and at least one area of the first or second split electrode ELT11 or ELT12 corresponding to the first end EP1. The first end EP1 of at least one first or second light emitting element LD1 or LD2 may be electrically connected to the corresponding first or second split electrode ELT11 or ELT12 by the first contact electrode CNE1. Likewise, each second contact electrode CNE2 may overlap the second end EP2 of at least one first or second light emitting element LD1 or LD2 and at least one area of the second pixel electrode ELT2 corresponding to the second end EP2. The second end EP2 of at least one first or second light emitting element LD1 or LD2 may be electrically connected to the corresponding second pixel electrode ELT2 by the second contact electrode CNE2.

A group of light emitting elements LD connected between each first or second split electrode ELT11 or ELT12 and the second pixel electrode ELT2 may form the light source unit LSU of the corresponding pixel PXL. For example, at least one first light emitting element LD1 connected in a forward direction between the first split electrode ELT11 and the second pixel electrode ELT2 may form the first light source unit LSU1. At least one second light emitting element LD2 connected in the forward direction between the second split electrode ELT12 and the second pixel electrode ELT2 may form the second light source unit LSU2.

In an embodiment, the first and second light source units LSU1 and LSU2 may be formed in respective areas having the same surface area or different surface areas. For example, the first and second sub-emission areas SEA1 and SEA2 may have a substantially identical or similar surface area. Furthermore, the first and second split electrodes ELT11 and ELT12 may have the same number and size (e.g., a length or the like). For example, the numbers of first and second split electrodes ELT11 and ELT12 that are respectively in first and second sub-emission areas SEA1 and SEA2 are the same as each other, and the first and second split electrodes ELT11 and ELT12 may have substantially the same shape and size. For example, the first and second pixel electrodes ELT1 and ELT2 of each pixel PXL may have a substantially identical or similar configuration in the first and second sub-emission areas SEA1 and SEA2. In this case, the number of first light emitting elements LD1 provided in the first light source unit LSU1 (particularly, valid light emitting elements disposed in the first sub-emission area SEA1) may be substantially identical or similar to the number of second light emitting elements LD2 provided in the second light source unit LSU2 (particularly, valid light emitting elements disposed in the second sub-emission area SEA2).

Figure 8:
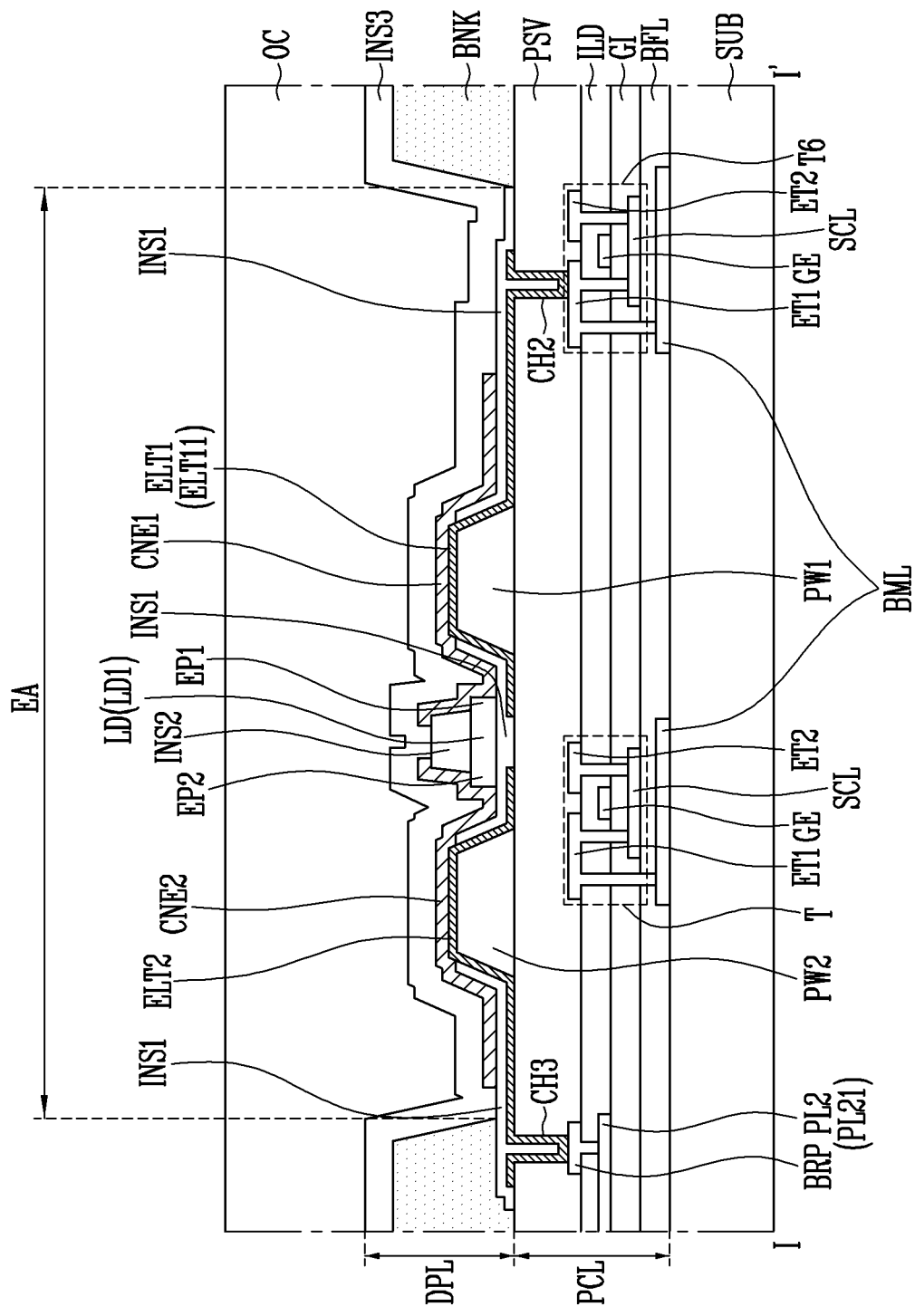
FIG. 8 schematically illustrates an embodiment of a cross-section corresponding to line I-I' of FIG. 7.

FIG. 8 schematically illustrates an embodiment of a cross-section taken along line I-I' of FIG. 7. In an embodiment, FIG. 8 illustrates a cross-section of the pixel PXL, focused on an area of the first sub-emission area SEA1 on which a first light emitting element LD1 is disposed. In some embodiments, the first and second sub-emission areas SEA1 and SEA2 may have a substantially identical or similar cross-sectional structure. Therefore, with reference to FIG. 8, the cross-sectional structure of each pixel PXL will be described with the cross-section of the first sub-emission area SEA1 taken along line I-I' of FIG. 7.

Referring to FIGS. 4 to 8, the display device in accordance with an embodiment may include a substrate SUB, and a pixel circuit layer PCL and a display element layer DPL which are successively disposed on a surface of the substrate SUB. For example, the pixel circuit layer PCL may be formed on a surface of the substrate SUB, and the display element layer DPL may be formed over the surface of the substrate SUB on which the pixel circuit layer PCL has been formed.

The substrate SUB may form a base of the display panel. In an embodiment, the substrate SUB may be a rigid or flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but the disclosure is not limited thereto. For instance, the substrate SUB may be a translucent substrate, an opaque substrate, or a reflective substrate. In an embodiment, in lieu of the substrate SUB, at least one insulating layer or the like may form the base of the display panel.

An area on the substrate SUB may be defined as a display area (e.g., an area corresponding to the pixel unit 100 as an area in which an image is displayed). The pixels PXL may be disposed in the display area. For example, the first and second driving circuits PXC1 and PXC2 and the first and second light source units LSU1 and LSU2 electrically connected thereto may be disposed in each pixel area of the display area.

In an embodiment, the pixel circuit layer PCL may include each pixel circuit PXC (e.g., first and second driving circuits PXC1 and PXC2) and/or lines electrically connected thereto. For example, the pixel circuit layer PCL may include circuit elements, e.g., first to twelfth transistors T1 to T12 and first and second capacitors C1 and C2, which form the first and second driving circuits PXC1 and PXC2 of each pixel PXL. Furthermore, the pixel circuit layer PCL may further include various signal lines (e.g., the scan line S and the data line D) electrically connected to each pixel circuit PXC, and various power lines (e.g., the first and second power lines PL1 and PL2) electrically connected to the pixel circuit PXC and/or the first and second light emitting elements LD1 and LD2. In the case where as described in the embodiment of FIG. 7, first split electrodes ELT11 are electrically connected by the first connection electrode CNL1 provided therebelow and second split electrodes ELT12 are electrically connected by the second connection electrode CNL2 provided therebelow, the pixel circuit layer PCL may further include first and second connection electrodes CNL1 and CNL2.

In an embodiment, the cross-sectional structures of transistors provided in each pixel circuit PXC may be substantially identical or similar to each other. However, the disclosure is not limited thereto. For example, in an embodiment, at least some of the transistors may have different types and/or structures. For the sake of explanation, hereinafter the term "transistor T" or "transistors T" will be used to denote at least one transistor of the transistors provided in the pixel circuit PXC or denote the transistors.

The pixel circuit layer PCL may include insulating layers. For example, the pixel circuit layer PCL may include a buffer layer BFL, a gate insulating layer GI, an interlayer insulating layer ILD, and a passivation layer PSV which are successively stacked on a surface of the substrate SUB.

The pixel circuit layer PCL may selectively further include at least one light shielding pattern BML, disposed under at least some transistors T. For example, the pixel circuit layer PCL may include light shielding patterns BML disposed to overlap the transistors T between the substrate SUB and the buffer layer BFL. For example, each light shielding pattern BML may be disposed on the substrate SUB such that the light shielding pattern BML is disposed under a semiconductor layer SCL used to form each transistor T.

In an embodiment, the light shielding pattern BML may be made of an opaque conductive material or an insulating material having light shielding characteristics and may block light from being drawn from a rear surface of the substrate SUB into the pixel circuit layer PCL, particularly, the transistors T. In an embodiment, the light shielding pattern BML may include black matrix material and/or metal, but the disclosure is not limited thereto. In an embodiment, in the case where the light shielding pattern BML is made of a conductive material, e.g., metal, the light shielding pattern BML may be electrically connected to an electrode of each transistor T.

In an embodiment, the buffer layer BFL may prevent impurities from diffusing into each circuit element. The buffer layer BFL may be formed of a single layer or multiple layers having at least two layers. In the case where the buffer layer BFL has a multi-layer structure, the respective layers may be formed of the same material or different materials. In an embodiment, the buffer layer BFL may be omitted.

In an embodiment, each transistor T may include a semiconductor layer SCL, a gate electrode GE, a first transistor electrode ET1, and a second transistor electrode ET2. Although FIG. 8 illustrates an embodiment in which each transistor T includes the first and second electrodes ET1 and ET2 that are formed separately from the semiconductor layer SCL, the disclosure is not limited thereto. For example, in an embodiment, the first and/or second electrode ET1 and/or ET2 provided in at least one transistor T disposed in each pixel area may be integral with the corresponding semiconductor layer SCL.

The semiconductor layer SCL may be disposed on the buffer layer BFL. For example, the semiconductor layer SCL may be disposed between the gate insulating layer GI and the substrate SUB on which the buffer layer BFL is formed. The semiconductor layer SCL may include a first area which contacts the first transistor electrode ET1, a second area which contacts the second transistor electrode ET2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with a predetermined impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and may overlap at least one area of the semiconductor layer SCL.

The first and second transistor electrodes ET1 and ET2 may be disposed over the semiconductor layer SCL and the gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to the semiconductor layer SCL. For example, the first and second transistor electrodes ET1 and ET2 may be respectively connected to the first area and the second area of the semiconductor layer SCL through corresponding contact holes which pass through the gate insulating layer GI and the interlayer insulating layer ILD.

In an embodiment, at least one transistor T provided in the pixel circuit PXC may be electrically connected to a pixel electrode. For example, one of the first and second transistor electrodes ET1 and ET2 of the first transistor T1 may be electrically connected to the first split electrode ELT11 of the first light source unit LSU1 disposed over the passivation layer PSV, through the second contact hole CH2 passing through the passivation layer PSV. Likewise, in the second sub-emission area SEA2, one of the first and second transistor electrodes ET1 and ET2 of the twelfth transistor T12 may be electrically connected to the second split electrode ELT12 of the second light source unit LSU2 disposed over the passivation layer PSV, through the fifth contact hole CH5 passing through the passivation layer PSV.

In an embodiment, at least one signal line and/or power line that is electrically connected to each pixel PXL may be disposed on a layer identical to that of an electrode of each of the circuit elements that form the pixel circuit PXC. For example, the second power line PL2 for supplying the second power supply VSS may be disposed on a layer identical to that of the gate electrodes GE of the transistors T, and may be electrically connected to the second pixel electrode ELT2 of the first and/or second light source unit LSU1 and/or LSU2 disposed on the passivation layer PSV, through a bridge pattern BRP disposed on the same layer as that of the first and second transistor electrodes ET1 and ET2 and through at least one third contact hole CH3 passing through the passivation layer PSV. However, the structures and/or positions of the second power line PL2 or the like may be changed in various ways.

In an embodiment, the display element layer DPL may include a light source unit LSU (e.g., first and second light source units LSU1 and LSU2) of each of the pixels PXL. For example, the display element layer DPL may include the first and second split electrodes ELT11 and ELT12 that form the first pixel electrode ELT1 of each pixel PXL, the second pixel electrode ELT2, and the first and second light emitting elements LD1 and LD2 electrically connected between the first and second pixel electrodes ELT1 and ELT2.

For example, the display element layer DPL may include at least one pair of first and second pixel electrodes ELT1 and ELT2 disposed in each emission area EA, light emitting elements LD disposed between the first and second pixel electrodes ELT1 and ELT2, and first and second contact electrodes CNE1 and CNE2 respectively disposed on first and second ends EP1 and EP2 of the light emitting elements LD. The display element layer DPL may further include, e.g., at least one conductive layer and/or at least one insulating layer (or insulating pattern). For example, the display element layer DPL may further include at least one of at least one pair of first and second partition walls PW1 and PW2 and first, second, and third insulating layers INS1, INS2, and INS3.

In an embodiment, the first and second partition walls PW1 and PW2 may be disposed on the pixel circuit layer PCL. For example, at least one pair of first and second partition walls PW1 and PW2 may be disposed in the emission area EA of each pixel PXL.

In an embodiment, each of the first and second partition walls PW1 and PW2 may include an insulating material including an inorganic or organic material. Furthermore, each of the first and second partition walls PW1 and PW2 may have a single-layer structure or a multi-layer structure. The material and/or the stacked structure of each of the first and second partition walls PW1 and PW2 may be changed in various ways rather than being particularly limited.

In an embodiment, each of the first and second partition walls PW1 and PW2 may have various shapes. For example, as illustrated in FIG. 8, each of the first and second partition walls PW1 and PW2 may have the cross-sectional shape of a trapezoid, the width of which reduces from a bottom to a top thereof. In this case, each of the first and second partition walls PW1 and PW2 may have an inclined surface on at least one side thereof. However, the disclosure is not limited thereto. For example, in an embodiment, each of the first and second partition walls PW1 and PW2 may have a semicircular or semielliptical cross-section the width of which gradually reduces upward. In this case, each of the first and second partition walls PW1 and PW2 may have a curved surface on at least one side thereof. In other words, the shape of each of the first and second partition walls PW1 and PW2 may be changed in various ways rather than being particularly limited.

In an embodiment, the first and second pixel electrodes ELT1 and ELT2 may be disposed in each emission area EA in which the first and second partition walls PW1 and PW2 are formed. In an embodiment, the first and second pixel electrodes ELT1 and ELT2 may be disposed at positions spaced apart from each other by a predetermined distance on the substrate SUB on which the pixel circuit layer PCL and/or the first and second partition walls PW1 and PW2 are formed.

In an embodiment, the first pixel electrodes ELT1 may be disposed on the respective first partition walls PW1, and the second pixel electrodes ELT2 may be disposed on the respective second partition wall PW2. In an embodiment, one of the first and second pixel electrodes ELT1 and ELT2 may be an anode electrode, and the other may be a cathode electrode.

At least a part of the first and second pixel electrodes ELT1 and ELT2 may respectively have shapes corresponding to those of the first and second partition walls PW1 and PW2. For example, each first pixel electrode ELT1 may protrude in a height direction of the substrate SUB by the corresponding first partition wall PW1 and may have a curved or inclined surface corresponding to the cross-section of the first partition wall PW1. For example, each first pixel electrode ELT1 may protrude in the height direction of the substrate SUB by the first partition wall PW1 provided under the first pixel electrode ELT1 and may have a curved or inclined surface facing the first end EP1 of the adjacent light emitting element LD. Likewise, each second pixel electrode ELT2 may protrude in the height direction of the substrate SUB by the corresponding second partition wall PW2 and may have a curved or inclined surface corresponding to the cross-section of the second partition wall PW2. For example, each second pixel electrode ELT2 may protrude in the height direction of the substrate SUB by the second partition wall PW2 provided under the second pixel electrode ELT2 and may have a curved or inclined surface facing the second end EP2 of the adjacent light emitting element LD.

In an embodiment, each of the first and second pixel electrodes ELT1 and ELT2 may include at least one conductive material. For example, each of the first and second pixel electrodes ELT1 and ELT2 may include at least one of metal such as Ag, Mg, Al, Pt, Pd, Au, Ni, Nd, Ir, Cr, Ti or an alloy thereof, conductive oxide such as ITO, IZO, ZnO, or ITZO, and a conductive polymer such as PEDOT. However, the disclosure is not limited thereto.

In an embodiment, each of the first and second pixel electrodes ELT1 and ELT2 may have a single-layer or multi-layer structure. For example, each of the first and second pixel electrodes ELT1 and ELT2 may include at least one reflective electrode layer. Furthermore, each of the first and second pixel electrodes ELT1 and ELT2 may selectively further include at least one transparent electrode layer disposed over and/or under the reflective electrode layer.

In an embodiment, the reflective electrode layer of each of the first and second pixel electrodes ELT1 and ELT2 may be formed of (or include) a conductive material having uniform reflectivity. For example, the reflective electrode layer may include at least one of metals such as Ag, Mg, Al, Pt, Pd, Au, Ni, Nd, Ir, Cr, and an alloy thereof. However, the disclosure is not limited thereto. In other words, reflective electrode layer may be formed of various reflective conductive materials.

In an embodiment, the transparent electrode layer of each of the first and second pixel electrodes ELT1 and ELT2 may be formed of various types of transparent electrode materials. For example, the transparent electrode layer may include ITO, IZO or ITZO, but the disclosure is not limited thereto.

In an embodiment, each of the first and second pixel electrodes ELT1 and ELT2 may have a three-layer structure having a stacked structure of ITO/Ag/ITO. As such, if the first and second pixel electrodes ELT1 and ELT2 each have a multi-layer structure of at least two layers, a voltage drop due to signal delay may be reduced or minimized.

Furthermore, if each of the first and second pixel electrodes ELT1 and ELT2 includes at least one reflective electrode layer, light emitted from the opposite ends of each light emitting elements LD, i.e., the first and second ends EP1 and EP2 of the light emitting elements LD, may travel in a direction (e.g., in the frontal direction of the display panel) in which an image is displayed. Particularly, if the first and second pixel electrodes ELT1 and ELT2 respectively have curved or inclined surfaces corresponding to the shapes of the first and second partition walls PW1 and PW2 and are respectively disposed to face the first and second ends EP1 and EP2 of the light emitting elements LD, light emitted from the first and second ends EP1 and EP2 of each light emitting element LD may be reflected by the first and second pixel electrodes ELT1 and ELT2 and may thus further reliably travel in the frontal direction of the display panel (e.g., in an upward direction of the substrate SUB). Therefore, the efficiency of light emitted from the light emitting elements LD may be enhanced.

In an embodiment, each of the first and second partition walls PW1 and PW2 may also function as a reflective member. For example, the first and second partition walls PW1 and PW2, along with the first and second pixel electrodes ELT1 and ELT2 provided on the first and second partition walls PW1 and PW2, may function as reflective components for enhancing the efficiency of light emitted from each of the light emitting elements LD.

In an embodiment, the first and second partition walls PW1 and PW2 may have the same height, so that the first and second pixel electrodes ELT1 and ELT2 may have the same height. As such, if the first and second pixel electrodes ELT1 and ELT2 have the same height, the light emitting elements LD may be more reliably connected between the first and second pixel electrodes ELT1 and ELT2. However, the disclosure is not limited thereto. For example, the shapes, structures, heights, and/or relative disposition relationship of the first and second pixel electrodes ELT1 and ELT2 may be changed in various ways.

At least one conductive capping layer may be selectively disposed on each of the first and second pixel electrodes ELT1 and ELT2. For example, a first conductive capping layer may be formed on each first pixel electrode ELT1 to cover or overlap the first pixel electrode ELT1, and a second conductive capping layer may be formed on each second pixel electrode ELT2 to overlap the second pixel electrode ELT2.

Each of the first and second conductive capping layers may be formed of a transparent conductive material such as ITO or IZO so as to minimize loss of light emitted from the light emitting elements LD. However, the disclosure is not limited thereto. For example, the material of the first and second conductive capping layers may be changed in various ways.

In the case where at least one conductive capping layer is formed over each of the first and second pixel electrodes ELT1 and ELT2, the first and second pixel electrodes ELT1 and ELT2 may be prevented from being damaged because of defects which may occur during a process of fabricating the display panel. Furthermore, the first and second conductive capping layers may enhance adhesive force between the substrate SUB provided with the pixel circuit layer PCL, etc., and the first and second pixel electrodes ELT1 and ELT2. In an embodiment, at least one of the first and second conductive capping layers may be omitted. As another example, in an embodiment, the first and second conductive capping layers may be regarded as being components of the first and second pixel electrodes ELT1 and ELT2, respectively. For example, each of the first and second pixel electrodes ELT1 and ELT2 may have a multi-layer structure including a reflective electrode layer and a conductive capping layer.

In an embodiment, a first insulating layer INS1 may be disposed in each emission area EA in which at least one pair of first and second pixel electrodes ELT1 and ELT2 are disposed. In an embodiment, the first insulating layer INS1 may be disposed between the pixel circuit layer PCL and the light emitting elements LD. The first insulating layer INS1 may stably support the light emitting elements LD and prevent the light emitting elements LD from being displaced from correct positions thereof.

The first insulating layer INS1 may partially overlap each of the first and second pixel electrodes ELT1 and ELT2. For example, the first insulating layer INS1 may overlap an area of each of the first and second pixel electrodes ELT1 and ELT2 and may include an opening to expose another area of each of the first and second pixel electrodes ELT1 and ELT2. In this case, in an area corresponding to the opening of the first insulating layer INS1, the first and second pixel electrodes ELT1 and ELT2 may respectively contact the first and second contact electrodes CNE1 and CNE2 provided thereover. Therefore, the first and second pixel electrodes ELT1 and ELT2 may be respectively and electrically connected to the first and second contact electrodes CNE1 and CNE2. In an embodiment, the first insulating layer INS1 may be formed in an independent pattern in each emission area EA. For example, in an embodiment, the first insulating layer INS1 may be formed of (or include) individual patterns partially disposed only under each of the light emitting elements LD.

In an embodiment, light emitting elements LD may be supplied and aligned in each emission area EA in which the first insulating layer INS1 is disposed. For example, at least one first light emitting element LD1 may be supplied and aligned in the first sub-emission area SEA1, and at least one second light emitting element LD2 may be supplied and aligned in the second sub-emission area SEA2.

In an embodiment, the light emitting elements LD may be self-aligned by an electric field formed between the first and second pixel electrodes ELT1 and ELT2 in case that predetermined voltages are applied to the first and second pixel electrodes ELT1 and ELT2. Therefore, the light emitting elements LD may be disposed between the first and second pixel electrodes ELT1 and ELT2.

The shape and/or structure of each light emitting element LD is not limited to the embodiment illustrated in FIG. 8, etc. For example, each light emitting element LD may have various known shapes, cross-sectional structures, and/or connection structures.

In an embodiment, a second insulating layer INS2 which overlaps portions of respective upper surfaces of the light emitting elements LD may be disposed in each emission area EA provided with the light emitting elements LD. In an embodiment, the second insulating layer INS2 may be selectively disposed on only upper portions of the light emitting elements LD without overlapping at least the opposite ends of the light emitting elements LD, e.g., the first and second ends EP1 and EP2. The second insulating layer INS2 may be formed as an independent pattern in each emission area EA. However, the disclosure is not limited thereto.

In an embodiment, the first and second contact electrodes CNE1 and CNE2 may be disposed in each emission area EA in which the second insulating layer INS2 is disposed. In an embodiment, the first and second contact electrodes CNE1 and CNE2 may be formed on the same layer by the same process. However, the disclosure is not limited thereto. For example, in an embodiment, the first and second contact electrodes CNE1 and CNE2 may be formed on different layers by different processes.

In an embodiment, the first contact electrode CNE1 may be disposed on the first pixel electrode ELT1 disposed in the corresponding emission area EA so that the first contact electrode CNE1 contacts the first pixel electrode ELT1. For example, the first contact electrode CNE1 may be disposed in an area of the first pixel electrode ELT1 that is not overlapped by the first insulating layer INS1, so that the first contact electrode CNE1 contacts the first pixel electrode ELT1. Furthermore, the first contact electrode CNE1 may be disposed on the first end EP1 of at least one light emitting element LD disposed in the corresponding emission area EA so that the first contact electrode CNE1 contacts the first end EP1. In other words, the first contact electrode CNE1 may overlap the first end EP1 of the light emitting element LD and at least one area of the first pixel electrode ELT1. Because of the first contact electrode CNE1, the first end EP1 of at least one light emitting element LD disposed in each emission area EA may be electrically connected to the first pixel electrode ELT1 disposed in the corresponding emission area EA.

In an embodiment, the second contact electrode CNE2 may be disposed on the second pixel electrode ELT2 disposed in the corresponding emission area EA so that the second contact electrode CNE2 contacts the second pixel electrode ELT2. For example, the second contact electrode CNE2 may be disposed in an area of the second pixel electrode ELT2 that is not overlapped by the first insulating layer INS1, so that the second contact electrode CNE2 contacts the second pixel electrode ELT2. Furthermore, the second contact electrode CNE2 may be disposed on the second end EP2 of at least one light emitting element LD disposed in the corresponding emission area EA so that the second contact electrode CNE2 contacts the second end EP2. In other words, the second contact electrode CNE2 may overlap the second end EP2 of the light emitting element LD and at least one area of the second pixel electrode ELT2. Because of the second contact electrode CNE2, the second end EP2 of at least one light emitting element LD disposed in each emission area EA may be electrically connected to the second pixel electrode ELT2 disposed in the corresponding emission area EA.

In an embodiment, a third insulating layer INS3 may be disposed in each emission area EA in which the first and second contact electrodes CNE1 and CNE2 are disposed. In an embodiment, the third insulating layer INS3 may be formed to cover or overlap the first and second pixel electrodes ELT1 and ELT2, the light emitting elements LD, and the first and second contact electrodes CNE1 and CNE2 that are disposed in the corresponding emission area EA.

In an embodiment, each of the first to third insulating layers INS1 to INS3 may have a single-layer or multi-layer structure and may include at least one inorganic insulating material and/or organic insulating material. For example, each of the first to third insulating layers INS1 to INS3 may include various kinds of known organic or inorganic insulating materials including SiNX, and the material of each of the first to third insulating layers INS1 to INS3 is not particularly limited. The first to third insulating layers INS1 to INS3 may include different insulating materials, respectively, or at least some of the first to third insulating layers INS1 to INS3 may include the same insulating material.

A bank BNK may be disposed around the emission area EA. For example, the bank BNK may be disposed between the pixels PXL to enclose each emission area EA. In an embodiment, the bank BNK may be disposed on a layer between the pixel circuit layer PCL and the third insulating layer INS3, but the disclosure is not limited thereto. For example, the bank BNK may be disposed on the first insulating layer INS1, as illustrated in FIG. 8. In an embodiment, the bank BNK and the first and second partition walls PW1 and PW2 may be disposed on the same layer. In this case, the bank BNK may be formed simultaneously with the first and second partition walls PW1 and PW2.

In an embodiment, the bank BNK may include at least one opaque material and thus have light shielding characteristics. For example, the bank BNK may include black matrix material, but the disclosure is not limited thereto.

In the disclosure, the position and/or material of the bank BNK may be changed in various ways. In an embodiment, a reflective layer, which is not illustrated, or the like may be further formed on at least one surface of the bank BNK. For example, a reflective layer, which is not illustrated, may be disposed on a sidewall of the bank BNK. In this case, the efficiency of light emitted from each pixel PXL may be enhanced.

In an embodiment, an overcoat layer OC may be disposed on the substrate SUB on which the first and second pixel electrodes ELT1 and ELT2, the light emitting elements LD, the first and second contact electrodes CNE1 and CNE2, the first to third insulating layers INS1 to INS3, and the bank BNK are disposed. For example, the overcoat layer OC may be formed on the entire surface of the pixel unit 100 to overlap the upper surface of the substrate SUB on which the display element layer DPL is formed. In an embodiment, the overcoat layer OC may include at least one inorganic layer and/or organic layer for protecting components of the display element layer DPL and may include various functional layers, etc.

Figure 9:
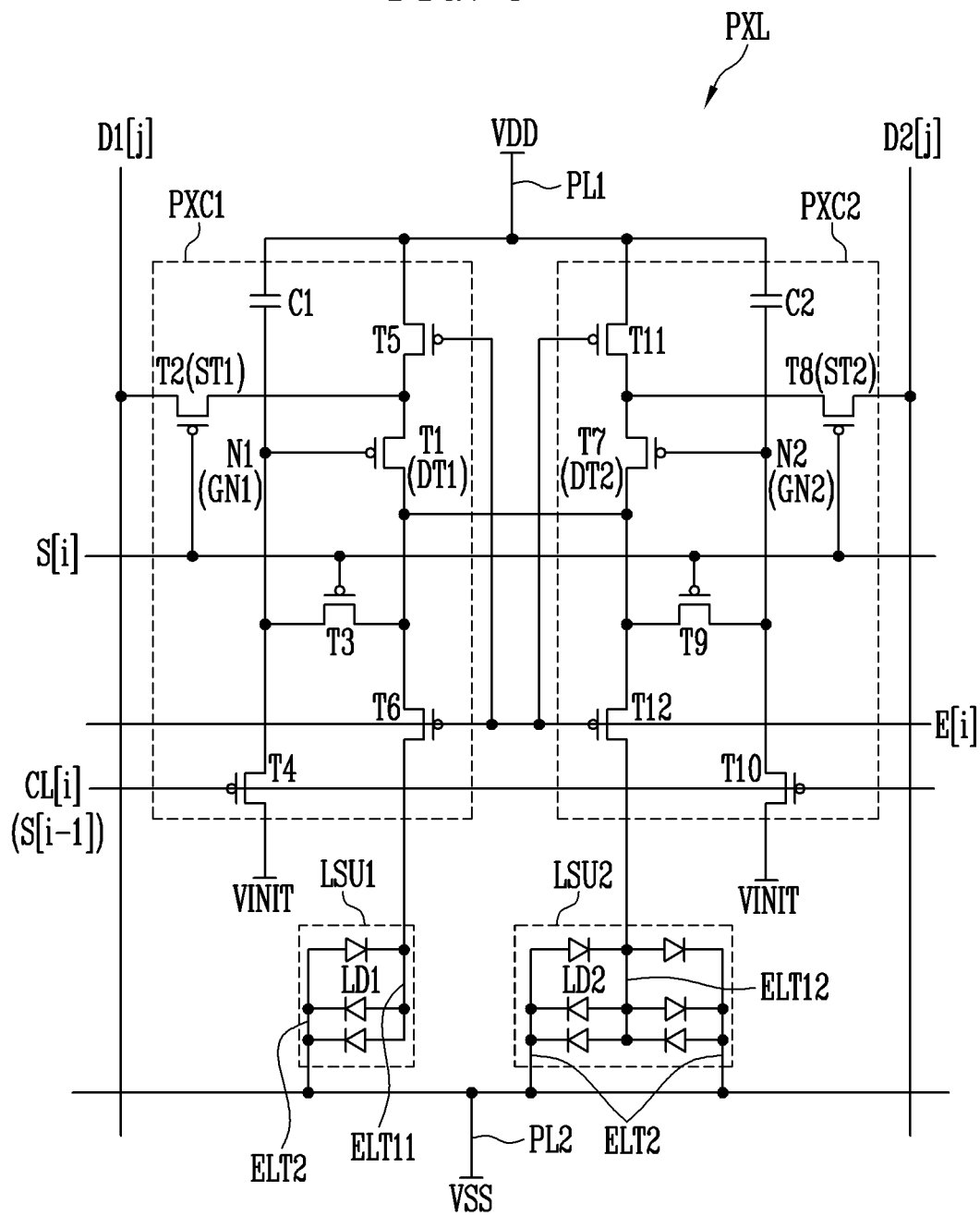
FIG. 9 schematically illustrates a pixel in accordance with an embodiment of the disclosure.
Figure 10:
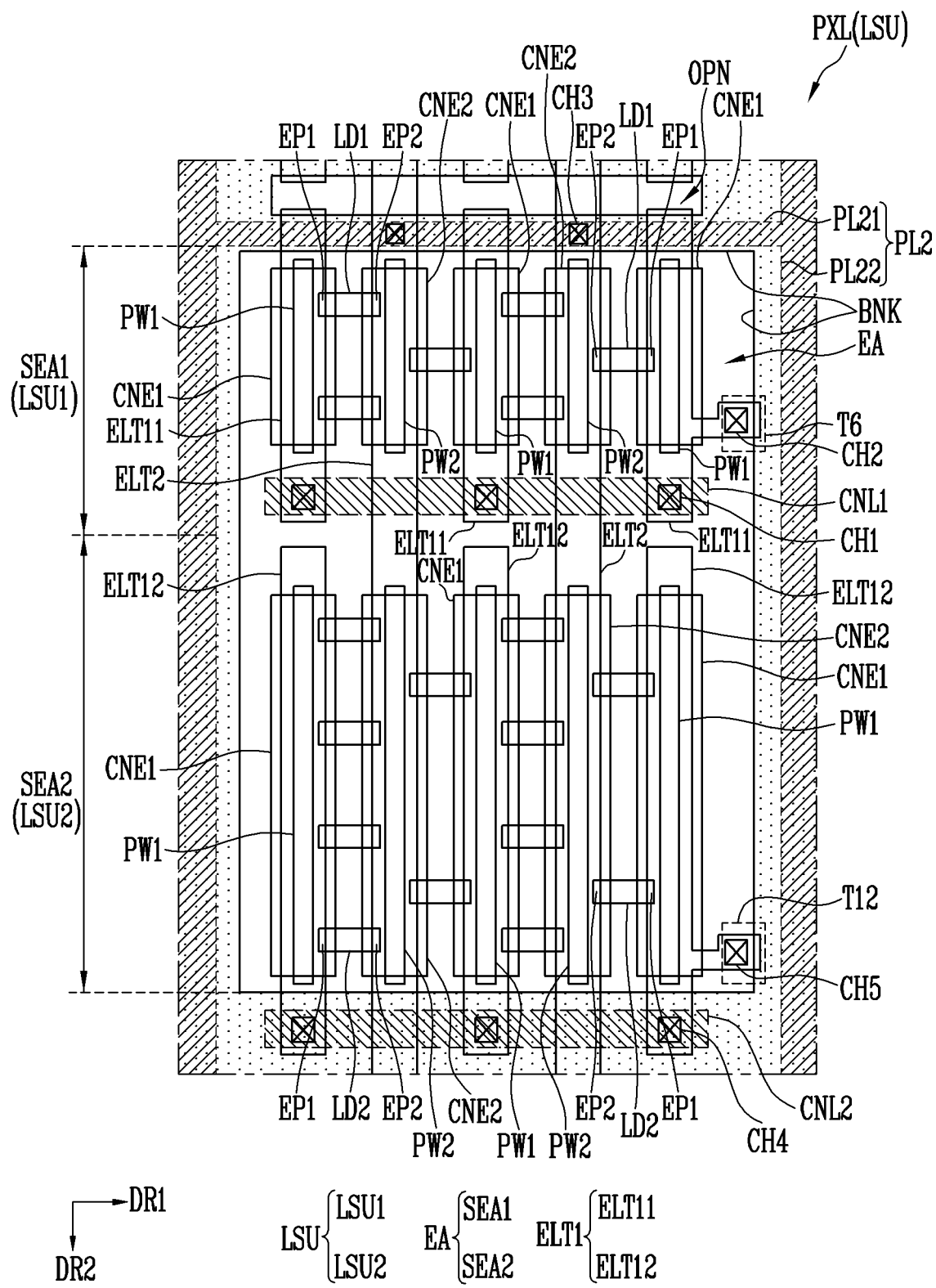
FIG. 10 schematically illustrates an embodiment of a light source unit of the pixel illustrated in FIG. 9.

FIG. 9 illustrates a pixel PXL in accordance with an embodiment. FIG. 10 illustrates an embodiment of the light source unit LSU of the pixel PXL illustrated in FIG. 9. FIGS. 9 and 10 illustrate a modification of the pixel PXL in accordance with the embodiment(s) of FIGS. 5 and 7. Like reference numerals are used to denote the same or similar components as those of the above-mentioned embodiment (s), and detailed descriptions thereof will be omitted.

Referring to FIGS. 9 and 10, the first and second sub-emission areas SEA1 and SEA2 may have different surface areas. For example, the second sub-emission area SEA2 may have a surface area corresponding to approximately double that of the first sub-emission area SEA1, but the disclosure is not limited thereto.

Furthermore, the first and second split electrodes ELT11 and ELT12 may be different in number and/or size (e.g., length or the like). For example, the numbers of first and second split electrodes ELT11 and ELT12 may be respectively the same as the numbers of first and second sub-emission areas SEA1 and SEA2. The first and second split electrodes ELT11 and ELT12 may have substantially the same width, and each second split electrode ELT12 may have a length corresponding to approximately double the length of each first split electrode ELT11.

In the foregoing embodiment(s), the number of second light emitting elements LD2 provided in the second light source unit LSU2 (particularly, the number of valid light emitting elements disposed in the second sub-emission area SEA2) may be greater than the number of first light emitting elements LD1 provided in the first light source unit LSU1 (particularly, the number of valid light emitting elements disposed in the first sub-emission area SEA1). For example, the number of second light emitting elements LD2 disposed in the second sub-emission area SEA2 may correspond to approximately double the number of first light emitting elements LD1 disposed in the first sub-emission area SEA1. In this case, the first and second light source units LSU1 and LSU2 may have different luminance characteristics. In an embodiment of the disclosure, taking into account the surface areas of the first and second sub-emission areas SEA1 and SEA2 and/or the number of light emitting elements LD disposed in the first and second light source units LSU1 and LSU2, the luminance and gamma characteristics of each pixel PXL may be controlled by adjusting the gamma value to be applied to the first and second data signals.

Figure 11:
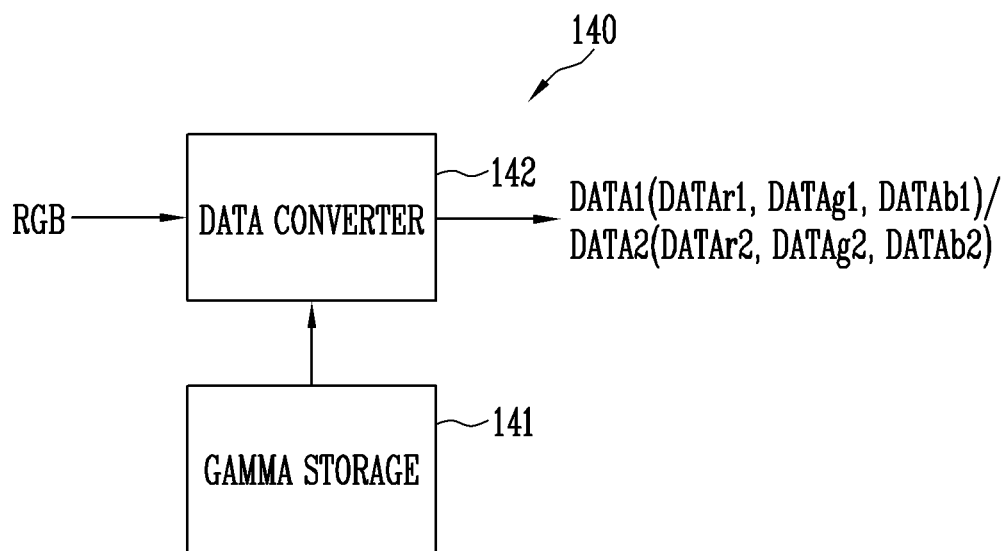
FIG. 11 schematically illustrates a timing controller in accordance with an embodiment of the disclosure.
Figure 12:
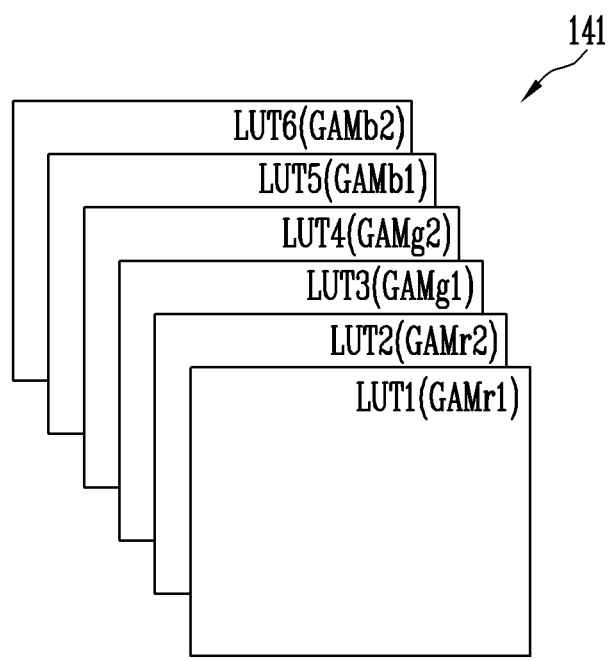
FIG. 12 schematically illustrates an embodiment of a gamma storage illustrated in FIG. 11.

FIG. 11 illustrates a timing controller 140 in accordance with an embodiment. For example, FIG. 11 illustrates an embodiment of the timing controller 140 which can be provided in the display device of FIG. 4. FIG. 12 illustrates an embodiment of a gamma storage 141 illustrated in FIG. 11.

Referring to FIGS. 4 to 12, the timing controller 140 in accordance with an embodiment may receive input image data RGB and generate first and second converted data DATA1 and DATA2 by using the input image data RGB. For example, the timing controller 140 may generate first and second converted data DATA1 and DATA2 corresponding to each pixel data and may output frame data DATA including the first and second converted data DATA1 and DATA2 of the respective pixels PXL. To this end, the timing controller 140 may include a gamma storage 141 and a data converter 142.

The gamma storage 141 may store first and second gamma values set to different values for respective pixels PXL (e.g., respective sub-pixels for colors). For example, the gamma storage 141 may include a first lookup table LUT1 in which first red digital gamma values GAMr1 corresponding to red pixels (or also referred to as "first sub-pixels") are stored, a second lookup table LUT2 in which second red digital gamma values GAMr2 corresponding to the red pixels are stored, a third lookup table LUT3 in which first green digital gamma values GAMg1 corresponding to green pixels (or also referred to as "second sub-pixels") are stored, a fourth lookup table LUT4 in which second green digital gamma values GAMg2 corresponding to the green pixels are stored, a fifth lookup table LUT5 in which first blue digital gamma values GAMb1 corresponding to blue pixels (or also referred to as "third sub-pixels") are stored, a sixth lookup table LUT6 in which second blue digital gamma values GAMb2 corresponding to the blue pixels are stored.

The data converter 142 may generate different first and second converted data DATA1 and DATA2 by respectively applying the first and second gamma values to image data corresponding to each pixel PXL (e.g., pixel data of each pixel PXL). For example, the data converter 142 may generate first and second red converted data DATAr1 and DATAr2 obtained by respectively applying the first and second red digital gamma values GAMr1 and GAMr2 to pixel data corresponding to each red pixel, first and second green converted data DATAg1 and DATAg2 obtained by respectively applying the first and second green digital gamma values GAMg1 and GAMg2 to pixel data corresponding to each green pixel, and first and second blue converted data DATAb1 and DATAb2 obtained by respectively applying the first and second blue digital gamma values GAMb1 and GAMb2 to pixel data corresponding to each blue pixel.

The first and second converted data DATA1 and DATA2 generated from the data converter 142 may be supplied to the data driver 130. In an embodiment, the data converter 142 may output frame data DATA in such a way that the first and second converted data DATA1 and DATA2 corresponding to each pixel PXL are alternately provided. For example, the timing controller 140 may alternately output the first and second converted data DATA1 and DATA2. For example, when outputting each frame data DATA, the data converter 142 may sequentially output first and second converted data DATA1 and DATA2 for a first pixel (hereinafter referred to as "first pixel"), and thereafter sequentially output first and second converted data DATA1 and DATA2 for a second pixel (hereinafter referred to as "second pixel"). In this way, the data converter 142 may output the first and second converted data DATA1 and DATA2 corresponding to the pixels PXL in each frame. However, the disclosure is not limited thereto. For example, in an embodiment, the data converter 142 may simultaneously output the first and second converted data DATA1 and DATA2 corresponding to each pixel PXL.

Figure 13:
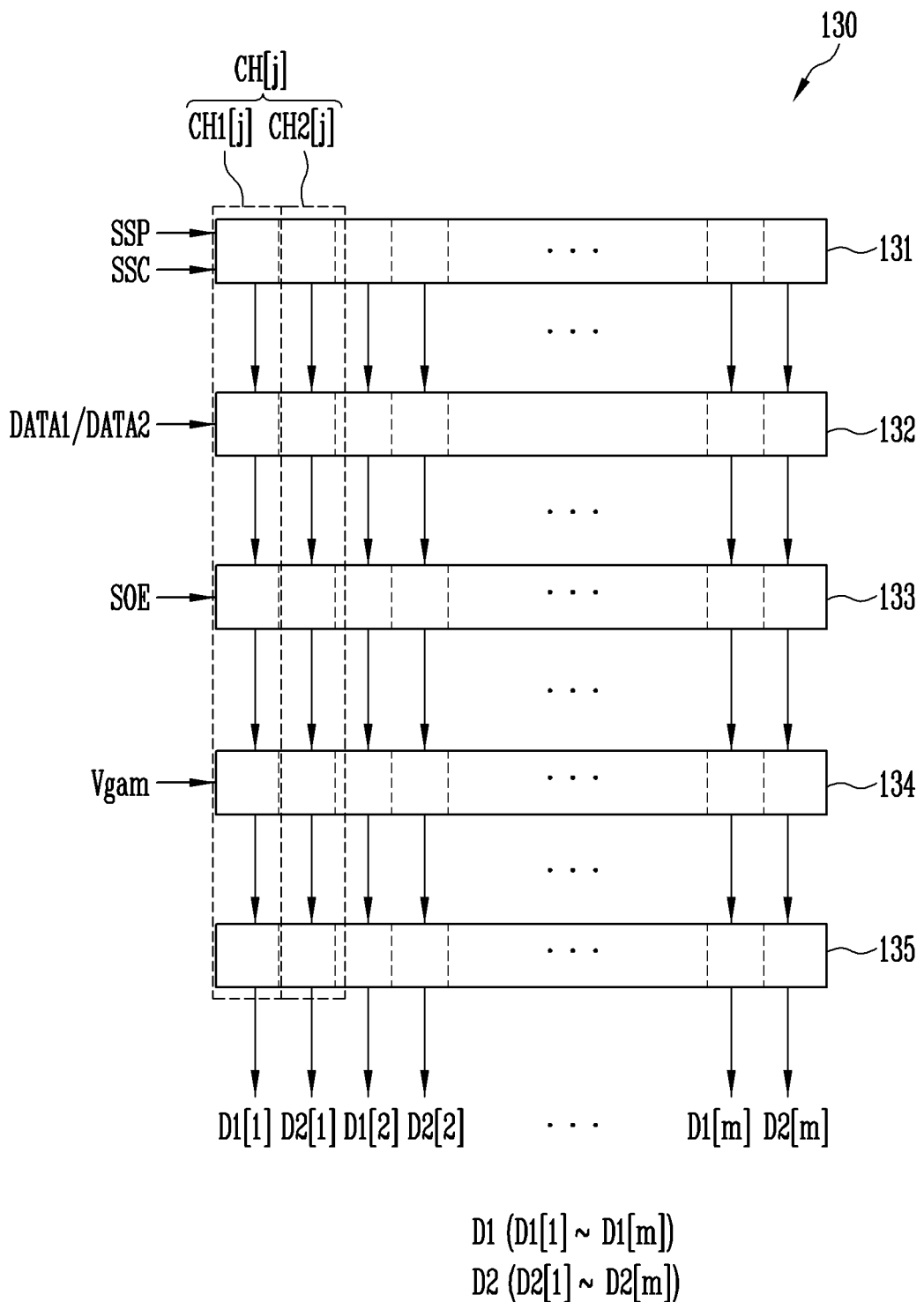
FIG. 13 schematically illustrates a data driver in accordance with an embodiment of the present disclosure.

FIG. 13 illustrates a data driver 130 in accordance with an embodiment. For example, FIG. 13 illustrates an embodiment of the data driver 130 which can be provided in the display device of FIG. 4.

Referring to FIGS. 4 to 13, the data driver 130 in accordance with an embodiment may generate first and second data signals DS1 and DS2 respectively corresponding to the first and second converted data DATA1 and DATA2 and may supply the first and second data signals DS1 and DS2 to the first and second data lines D1 and D2 of the corresponding pixel PXL. For example, the data driver 130 may generate a first data signal DS1 in response to each first converted data DATA1 supplied from the timing controller 140 and may output the first data signal DS1 to each first data line D1. The data driver 130 may generate a second data signal DS2 in response to each second converted data DATA2 supplied from the timing controller 140 and may output the second data signal DS2 to each second data line D2.

For example, the data driver 130 may include j-th first and second channels CH1[j] and CH2[j] electrically connected to first and second data lines D1[j] and D2[j] of a pixel PXL disposed in a j-th column. In an embodiment, the j-th first channel CH1[j] may receive first converted data DATA1 of a j-th pixel PXL of each horizontal line and may generate first data signal DS1 corresponding thereto. The j-th second channel CH2[j] may receive second converted data DATA2 of the j-th pixel PXL of each horizontal line and may generate second data signal DS2 corresponding thereto.

In an embodiment, the data driver 130 may include a shift register circuit 131, a sampling latch circuit 132, a holding latch circuit 133, a data signal generator 134, and a buffer circuit 135. The shift register circuit 131, the sampling latch circuit 132, and the holding latch circuit 133 may form an input component of the data driver 130. The buffer circuit 135 may form an output component of the data driver 130.

The shift register circuit 131 may be supplied with a source start pulse SSP and a source sampling clock SSC from the timing controller 140. The shift register circuit 131 may shift the source start pulse SSP in each cycle of the source sampling clock SSC and may sequentially generate sampling pulses. To this end, the shift register circuit 131 may include shift registers. For example, the shift register circuit 131 may include shift registers the number of which corresponds to the number of first and second data lines D1 and D2. For example, in the case where m vertical pixel columns (where m is a natural number) are disposed in the pixel unit 100, the shift register circuit 131 may include at least 2m shift registers for supplying first and second data signals DS1 and DS2 to each pixel PXL.

The sampling latch circuit 132 may sequentially store first and second converted data DATA1 and DATA2 supplied from the timing controller 140, in response to sampling pulses which are sequentially supplied from the shift register circuit 131. To this end, the sampling latch circuit 132 may include sampling latches. For example, the sampling latch circuit 132 may include sampling latches the number of which corresponds to the number of first and second data lines D1 and D2, for example, 2m sampling latches. In an embodiment, first converted data DATA1 corresponding to a first pixel may be stored in a sampling latch of a first channel, and second converted data DATA2 corresponding to the first pixel may be stored in a sampling latch of a second channel. Furthermore, first converted data DATA1 corresponding to a second pixel may be stored in a sampling latch of a third channel, and second converted data DATA2 corresponding to the second pixel may be stored in a sampling latch of a fourth channel. In this way, first or second converted data DATA1 or DATA2 corresponding to a pixel PXL may be stored in each sampling latch.

The holding latch circuit 133 may receive a source output enable signal SOE from the timing controller 140. The holding latch circuit 133 may receive, when the source output enable signal SOE is input thereto, first and second converted data DATA1 and DATA2 from the sampling latch circuit 132 and may store the first and second converted data DATA1 and DATA2. For example, the holding latch circuit 133 may simultaneously receive the first and second converted data DATA1 and DATA2 from the sampling latch circuit 132, in response the source output enable signal SOE. Furthermore, the holding latch circuit 133 may supply, when the source output enable signal SOE is input thereto, first and second converted data DATA1 and DATA2 stored therein to the data signal generator 134. To this end, the holding latch circuit 133 may include holding latches. For example, the holding latch circuit 133 may include holding latches the number of which corresponds to the number of first and second data lines D1 and D2, for example, 2m holding latches.

Although FIG. 13 illustrates an embodiment where the shift register circuit 131, the sampling latch circuit 132, and the holding latch circuit 133 form the input component of the data driver 130, the disclosure is not limited thereto. For example, the input component may further include various other known configurations.

The data signal generator 134 may generate first and second data signals DS1 and DS2 respectively by using first and second converted data DATA1 and DATA2 supplied from the input component. To this end, the data signal generator 134 may include digital-to-analog converters disposed on each channel. Each digital-to-analog converter (hereinafter referred to as "DAC") may select one of gamma voltages Vgam corresponding to each gray scale in response to first or second converted data DATA1 or DATA2 supplied to the DAC and may supply the selected gamma voltage Vgam as a first or second data signal DS1 or DS2 to each channel of the buffer circuit 135. For example, a first DAC disposed on a first channel of the data signal generator 134 may generate a first data signal DS1 corresponding to the first converted data DATA1 of the first pixel and may supply the first data signal DS1 to a first buffer disposed on a first channel of the buffer circuit 135. A second DAC disposed on a second channel of the data signal generator 134 may generate a second data signal DS2 corresponding to the second converted data DATA2 of the first pixel and may supply the second data signal DS2 to a second buffer disposed on a second channel of the buffer circuit 135. Likewise, a third DAC disposed on a third channel of the data signal generator 134 may generate a first data signal DS1 corresponding to the first converted data DATA1 of the second pixel and may supply the first data signal DS1 to a third buffer disposed on a third channel of the buffer circuit 135. A fourth DAC disposed on a fourth channel of the data signal generator 134 may generate a second data signal DS2 corresponding to the second converted data DATA2 of the second pixel and may supply the second data signal DS2 to a fourth buffer disposed on a fourth channel of the buffer circuit 135. In this way, the data signal generator 134 may generate first and second data signals DS1 and DS2 corresponding to the first and second converted data DATA1 and DATA2 of each pixel PXL and may output the first and second data signals DS1 and DS2 to each channel of the buffer circuit 135.

The buffer circuit 135 may include buffers disposed on respective channels of the data driver 130. The buffer circuit 135 may supply first and second data signals DS1 and DS2 supplied from the data signal generator 134 respectively to the first and second data lines D1 and D2. For example, the buffer circuit 135 may supply, to a 1-th first data line D1[1], a first data signal DS1 of the first pixel which is supplied from the first channel of the data signal generator 134, and may supply, to a 1-th second data line D2[1], a second data signal DS2 of the first pixel which is supplied from the second channel of the data signal generator 134. In this way, the buffer circuit 135 may supply first and second data signals DS1 and DS2 supplied from the data signal generator 134 respectively to the first and second data lines D1 and D2.

The data driver 130 according to the above-mentioned embodiment may include data channels the number of which corresponds to the number of first and second data lines D1 and D2. For example, the data driver 130 may include odd-numbered data channels (hereinafter referred to as "first data channels") corresponding to the respective first data lines D1, and even-numbered data channels (hereinafter referred to as "second data channels") corresponding to the respective second data lines D2. For example, the data driver 130 may include m j-th data channel pairs CH[j] (where j is a natural number between 1 and m, inclusive) including a j-th first data channel CH1[j] and a j-th second data channel CH2[j] each of which is connected to pixels PXL disposed on a j-th vertical line.

The data driver 130 may generate first and second data signals DS1 and DS2 respectively corresponding to first and second converted data DATA1 and DATA2 of each pixel PXL. The first and second data signals DS1 and DS2 generated from the data driver 130 may be supplied to each pixel PXL through the respective first and second data lines D1 and D2.

Figure 14:
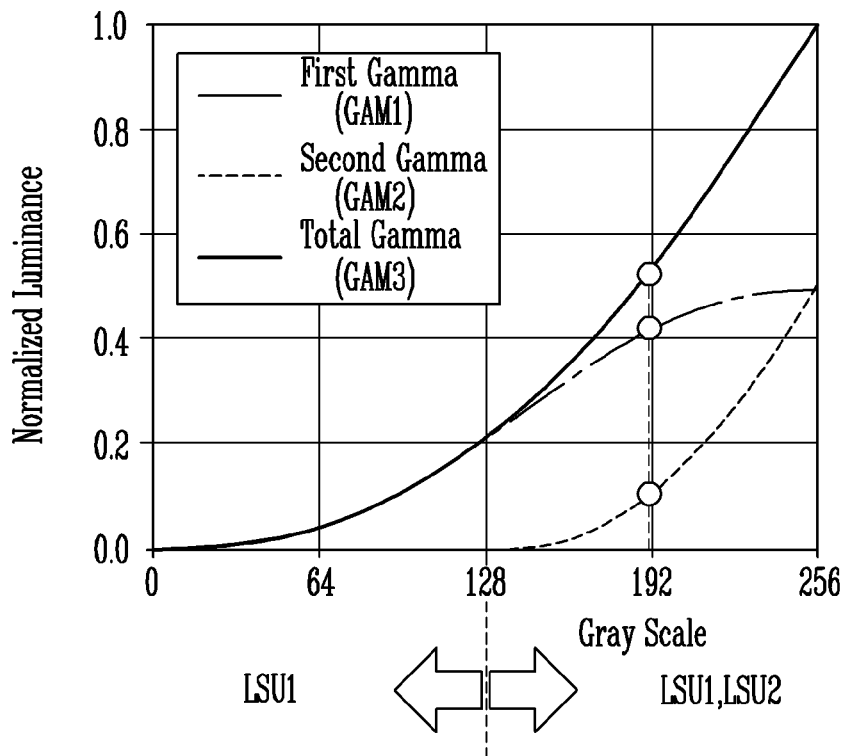
FIGS. 14 and 15 each schematically illustrate a gamma setting method in accordance with an embodiment of the disclosure.
Figure 15:
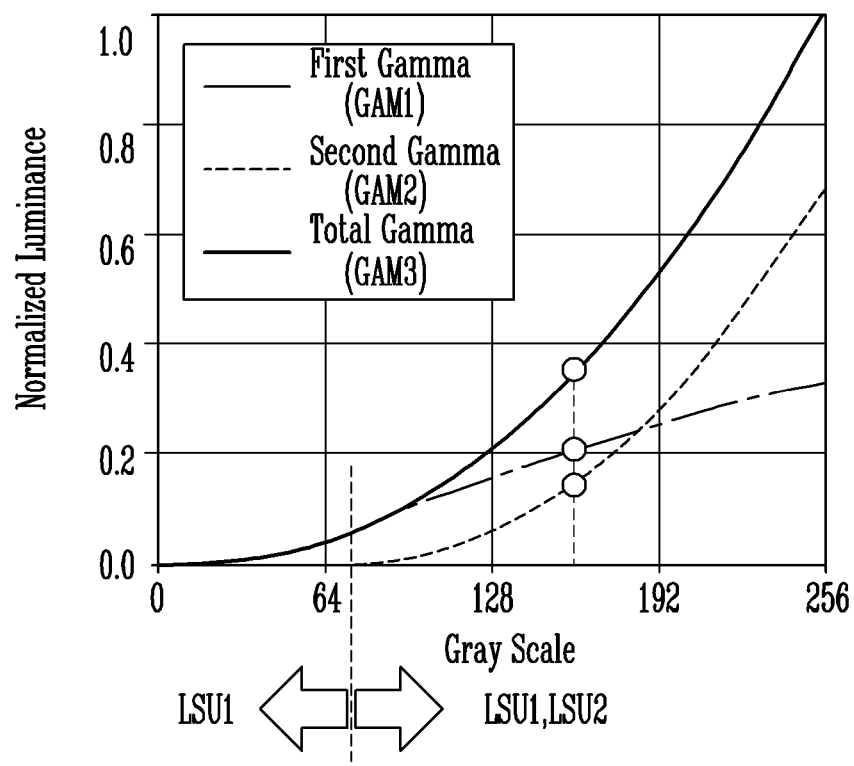

FIGS. 14 and 15 each illustrate a gamma setting method in accordance with an embodiment. For example, FIGS. 14 and 15 illustrate embodiments of first and second gamma values for respective pixels PXL having different structures.

In detail, FIG. 14 illustrates an embodiment of first and second gamma values of a pixel PXL in which as described in the embodiment(s) illustrated in FIGS. 5 and 7, the first and second sub-emission areas SEA1 and SEA2 have a size ratio of about 1:1, and substantially identical or similar numbers of first and second light emitting elements LD1 and LD2 are disposed in the first and second sub-emission areas SEA1 and SEA2. FIG. 15 illustrates an embodiment of first and second gamma values of a pixel PXL in which as described in the embodiment(s) illustrated in FIGS. 9 and 10, the first and second sub-emission areas SEA1 and SEA2 have a size ratio of about 1:2, and different numbers of first and second light emitting elements LD1 and LD2 (e.g., the numbers corresponding to approximately 1:2) are disposed in the first and second sub-emission areas SEA1 and SEA2.

Referring to FIGS. 4 to 15, first and second gamma values GAM1 and GAM2 (or first and second gamma curves) are set to different values. Therefore, the first light source unit LSU1 that is driven by a first data signal DS1 to which the first gamma value GAM1 is applied may display first gamma characteristics. The second light source unit LSU2 that is driven by a second data signal DS2 to which the second gamma value GAM2 is applied may display second gamma characteristics. Each pixel PXL may emit light corresponding to the sum of the amounts of light emitted from the first and second light source units LSU1 and LSU2 and may display gamma characteristics corresponding to a combination of the first and second gamma characteristics. For example, each pixel PXL may display gamma characteristics corresponding to a third gamma value GAM3 in which a combination of the first and second gamma values GAM1 and GAM2 is reflected.

In an embodiment, the third gamma value GAM3 may be a target gamma value, i.e., a gamma value corresponding to gamma characteristics desired to be ultimately displayed by the pixel PXL. For example, the third gamma value GAM3 may be set to about 2.2 gamma that is optimized for the visual characteristics of humans. The first and second gamma values GAM1 and GAM2 may be set to different values to obtain the ultimately desired third gamma value GAM3, taking into account the structure of the pixel PXL (e.g., a ratio of the numbers of valid light emitting elements disposed in the respective first and second sub-emission areas SEA1 and SEA2).

In an embodiment, the first and second gamma values GAM1 and GAM2 may be set such that only the first light source unit LSU1 is driven in a low gray scale area corresponding to a predetermined reference gray scale value or less, and both the first and second light source units LSU1 and LSU2 are driven in the other high gray scale area. For example, the second gamma value GAM2 may be set such that the second driving current is not supplied to the second light source unit LSU2 in the low gray scale area corresponding to the reference gray scale value or less.

In an embodiment, in the low gray scale area corresponding to the reference gray scale value or less, only some light emitting elements of the light emitting elements LD provided in each pixel PXL (e.g., at least one first light emitting element LD1 provided in the first light source unit LSU1) are driven, so that difficulties in controlling fine current can be overcome, and the low gray scale expression capability of the pixel PXL and the display device including the pixel PXL can be enhanced. Furthermore, in the other high gray scale area, both the first and second light source units LSU1 and LSU2 may be driven, so that a desired luminance can be effectively displayed.

Figure 16:
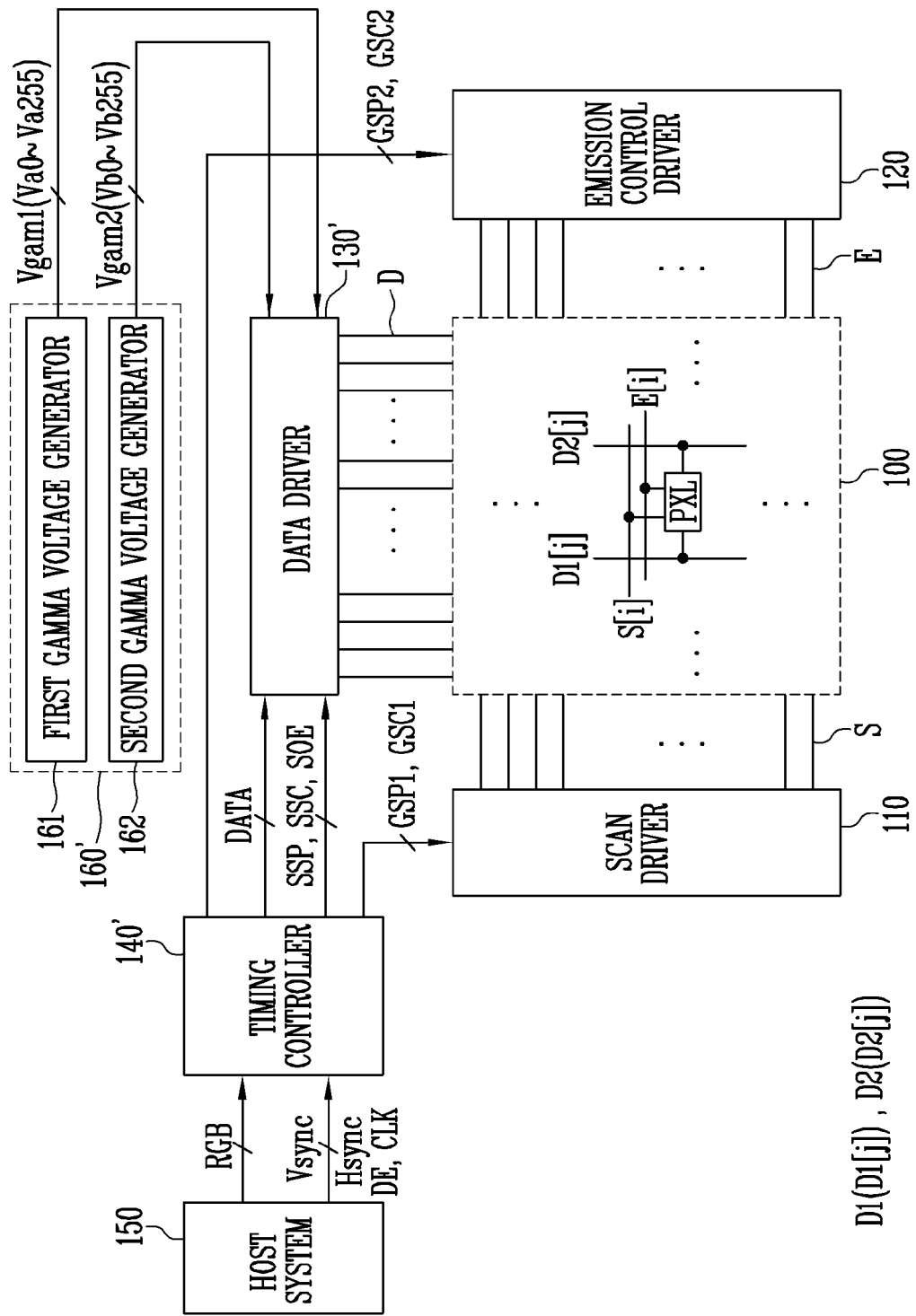
FIG. 16 schematically illustrates a display device in accordance with an embodiment of the disclosure.

FIG. 16 illustrates a display device in accordance with an embodiment. For example, FIG. 16 illustrates a modification of the display device in accordance with the embodiment of FIG. 4. Like reference numerals are used to denote the same or similar components as those of the above-mentioned embodiment, and detailed descriptions thereof will be omitted.

Referring to FIG. 16, a timing controller 140' may generate frame data DATA by rearranging input image data RGB and may output the frame data DATA to a data driver 130'. For example, the timing controller 140' may generate the frame data DATA by rearranging the input image data RGB in response to specifications of each display panel.

The data driver 130' may generate first and second data signals DS1 and DS2 for each pixel PXL in response to the frame data DATA and may output the first and second data signals DS1 and DS2 respectively to the first and second data lines D1 and D2. In an embodiment, the data driver 130' may generate first and second data signals DS1 and DS2 by respectively applying the first and second gamma values GAM1 and GAM2 to pixel data corresponding to each pixel PXL. For example, the data driver 130' may receive different first and second gamma voltages Vgam1 and Vgam2 in response to each gray scale and may generate the first and second data signals DS1 and DS2 by respectively applying the first and second gamma voltages Vgam1 and Vagm2 to each pixel data included in the frame data DATA.

In an embodiment, a gamma voltage generator 160' may include first and second gamma voltage generators 161 and 162 configured to generate the first and second gamma voltages Vgam1 and Vgam2 having different gamma characteristics in response to each gray scale. For example, the first gamma voltage generator 161 may generate gray scale voltages Va0 to Va255 for displaying first gamma characteristics according to the first gamma value GAM1. The second gamma voltage generator 162 may generate gray scale voltages Vb0 to Vb255 for displaying second gamma characteristics according to the second gamma value GAM2. The first and second gamma voltages Vgam1 and Vgam2 generated from the first and second gamma voltage generators 161 and 162 may be supplied to the data driver 130' and respectively used to generate the first and second data signals DS1 and DS2.

Figure 17:
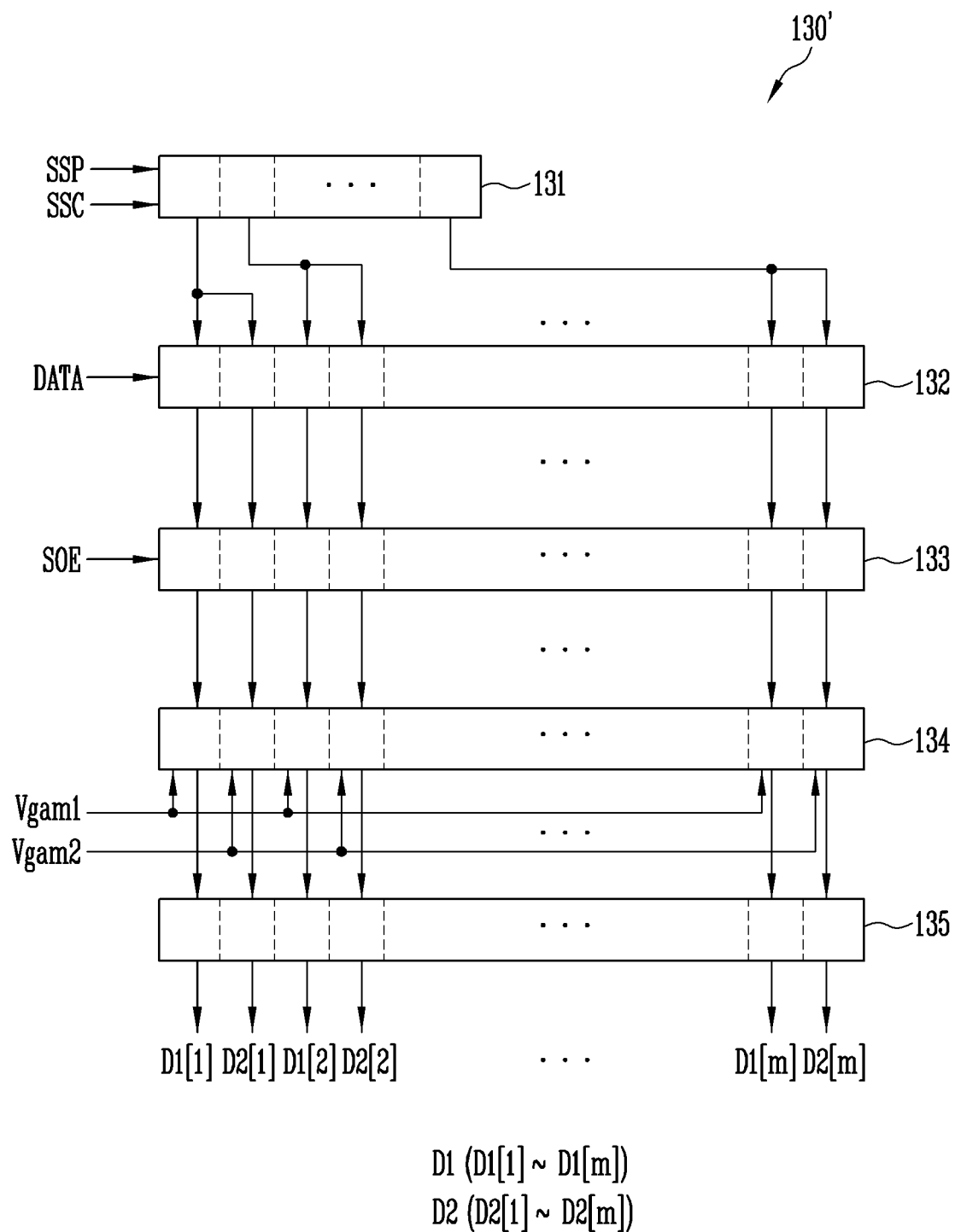
FIG. 17 schematically illustrates a data driver in accordance with an embodiment of the disclosure.

FIG. 17 illustrates a data driver 130' in accordance with an embodiment. For example, FIG. 17 is a diagram illustrating an embodiment of the data driver 130' which may be applied to the display device according to the embodiment of FIG. 16, and FIG. 17 illustrates a modification of the data driver 130 of FIG. 13. In FIG. 17, the same reference numerals are used to denote components similar or identical to those of the above-described embodiments, and detailed descriptions thereof will be omitted.

Referring to FIGS. 16 and 17, each shift register provided in the shift register circuit 131 may simultaneously supply a sampling pulse to a pair of sampling latches provided in the sampling latch circuit 132. Each pixel data included in the frame data DATA may be simultaneously stored in a pair of sampling latches corresponding to each pixel PXL, and then may be simultaneously supplied to a pair of DACs provided in the data signal generator 134 by the holding latch circuit 133.

In an embodiment, the data signal generator 134 may receive first and second gamma voltages Vgam1 and Vgam2 respectively corresponding to the first and second gamma values GAM1 and GAM2. For example, odd-numbered DACs may receive the first gamma voltage Vgam1 and generate first data signal DS1 corresponding to each pixel data. Even-numbered DACs may receive the second gamma voltage Vgam2 and generate a second data signal DS2 corresponding to each pixel data.

In this way, the data driver 130' may generate the first and second data signals DS1 and DS2 by respectively applying the first and second gamma values GAM1 and GAM2 to pixel data corresponding to each pixel PXL. The first and second data signals DS1 and DS2 generated from the data driver 130' may be respectively output to the first and second data lines D1 and D2.

Figure 18:
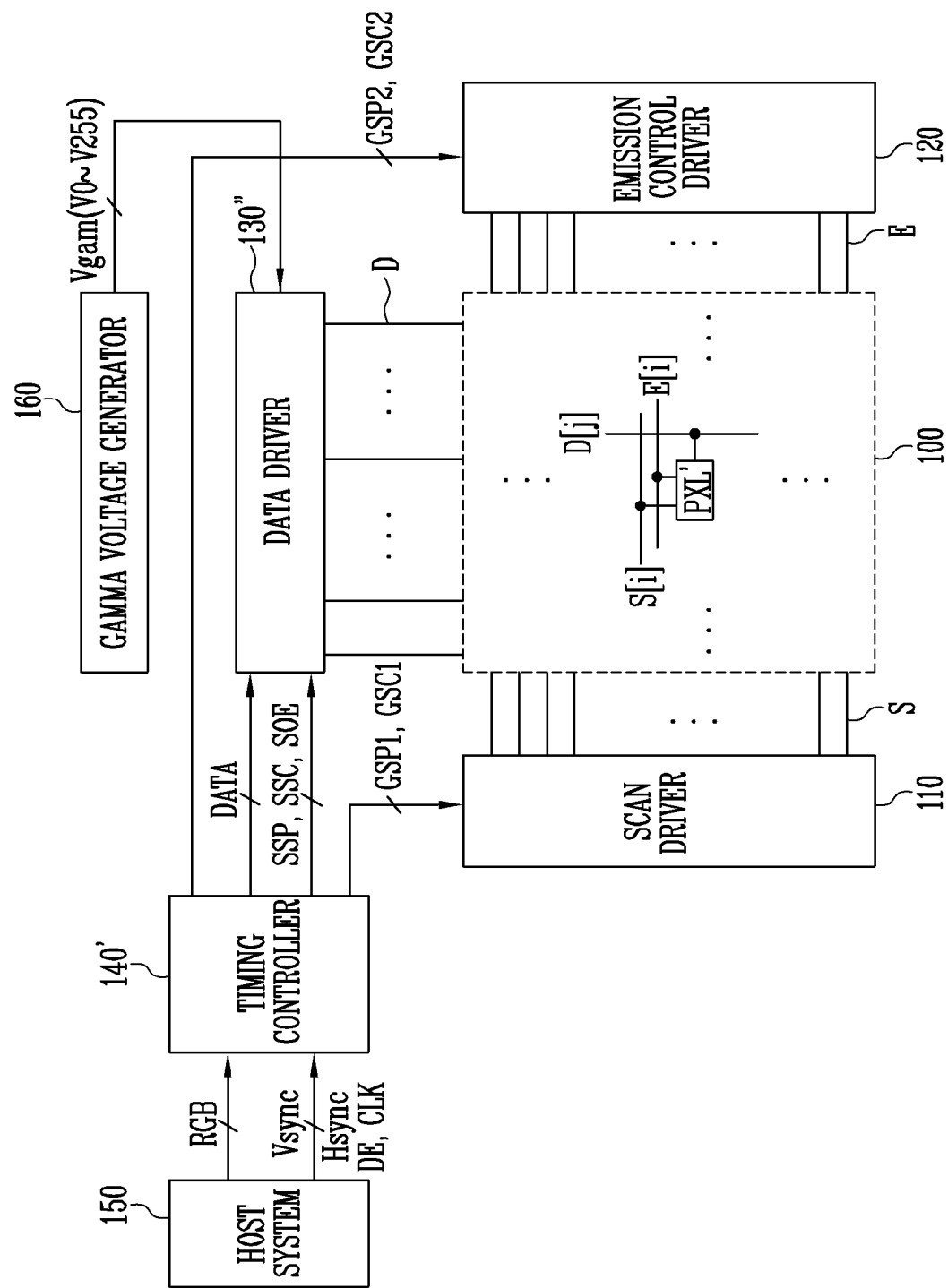
FIG. 18 schematically illustrates a display device in accordance with an embodiment of the disclosure.

FIG. 18 illustrates a display device in accordance with an embodiment. For example, FIG. 18 illustrates a modification of the embodiments of FIGS. 4 and 16. Like reference numerals are used to denote the same or similar components as those of the above-mentioned embodiments, and detailed descriptions thereof will be omitted.

Referring to FIG. 18, a timing controller 140' may generate frame data DATA by rearranging input image data RGB and may output the frame data DATA to a data driver 130". For example, the timing controller 140' may generate the frame data DATA by rearranging the input image data RGB in response to specifications of each display panel.

The data driver 130" may generate a data signal for each pixel PXL' in response to the frame data DATA and may output the data signal to the data line D of the corresponding pixel PXL'. In an embodiment, when m pixels PXL' are disposed on each horizontal line of the pixel unit 100, the data driver 130" may include m data channels connected to the respective pixels PXL'. During each horizontal period, the data driver 130" may supply respective data signals to the pixels PXL' of a corresponding horizontal line. In an embodiment, a gamma value to be applied to a data signal output from the data driver 130" may correspond to a target gamma value corresponding to gamma characteristics desired to be ultimately displayed by the pixel PXL'.

In an embodiment, a gamma value used to generate a data signal may be controlled by the timing controller 140' and/or the gamma voltage generator 160. For example, the timing controller 140' may generate frame data DATA to which a predetermined digital gamma value is applied in response to a gamma value to be applied to the data signal and may output the frame data DATA to the data driver 130". In an embodiment, the gamma voltage generator 160 may generate a predetermined gamma voltage Vgam corresponding to a gamma value to be applied to the data signal and may output the gamma voltage Vgam to the data driver 130".

Figure 19:
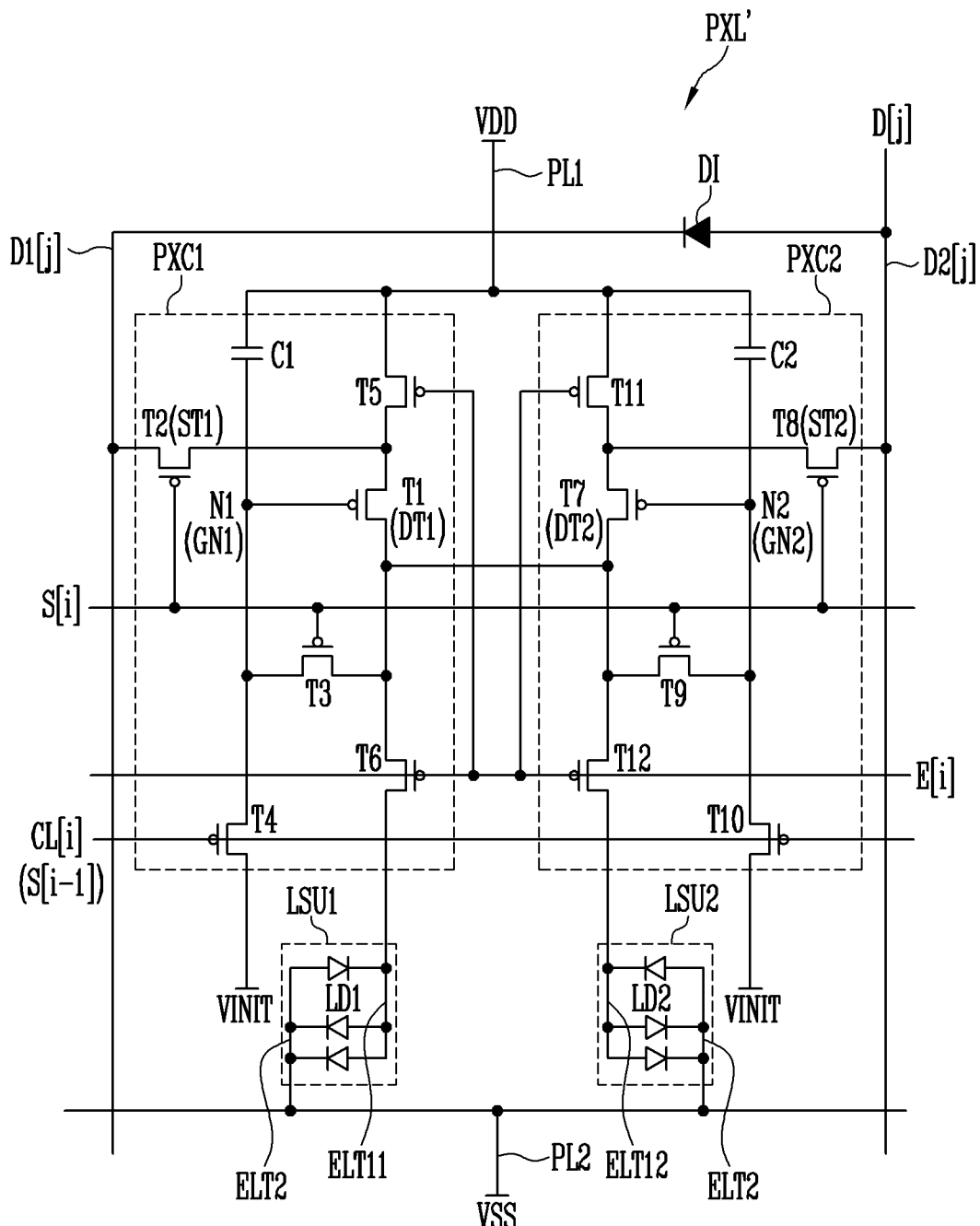
FIG. 19 schematically illustrates a pixel in accordance with an embodiment of the disclosure.
Figure 20:
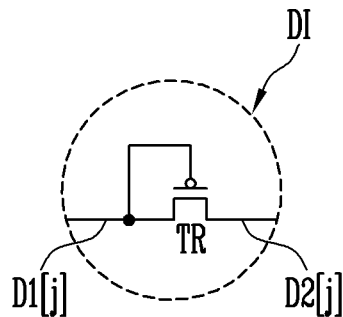
FIG. 20 schematically illustrates an embodiment of a diode of FIG. 19.

FIG. 19 schematically illustrates a pixel PXL' in accordance with an embodiment, and FIG. 20 schematically illustrates an embodiment for a diode DI of FIG. 19. For example, FIG. 19 is a diagram illustrating an embodiment of the pixel PXL' which may be applied to the display device according to the embodiment of FIG. 18, and FIG. 19 illustrates a modification of the pixel PXL of FIG. 5. In FIG. 19, like reference numerals are used to denote components similar or identical to those of the above-described embodiments, and detailed descriptions thereof will be omitted.

Referring to FIGS. 18 to 20, the pixel PXL' in accordance with an embodiment may further include a diode DI connected in a direction between a first data line D1[j] and a second data line D2[j]. Each pixel PXL' may be electrically connected to each channel of the data driver 130" through one of the first and second data lines D1[j] and D2[j].

For example, the diode DI may be connected in a direction from the second data line D2[j] toward the first data line D1[j]. In this case, the first data line D1[j] may be electrically connected to the data line D[j] of the corresponding pixel PXL' via the diode DI, and the second data line D2[j] may be directly electrically connected to the data line D[j] of the corresponding pixel PXL'.

Therefore, the first data signal DS1 to be supplied to the first data line D1[j] and the second data signal DS2 to be supplied to the second data line D2[j] may have different voltage levels. For example, a first data signal DS1 having a voltage lower, by the threshold voltage of the diode DI, than the voltage of the second data signal DS2 to be supplied to the second data line D2[j] may be supplied to the first data line D1[j].

In an embodiment, each of the transistors T, e.g., first and seventh transistors T1 and T7, which form the pixel circuit PXC may be a P-type transistor. In this case, if the voltage level of the first data signal DS1 is lower than the voltage level of the second data signal DS2, the first driving current flowing to the first light source unit LSU1 may be greater than the second driving current flowing to the second light source unit LSU2. Therefore, the first light source unit LSU1 may emit light at a luminance greater than that of the second light source unit LSU2.

In an embodiment, the diode DI may be formed of a transistor TR, a gate electrode of which is electrically connected to a source or drain electrode. However, the disclosure is not limited thereto, and for example, the type and/or structure of the diode DI may be changed in various ways.

Figure 21:
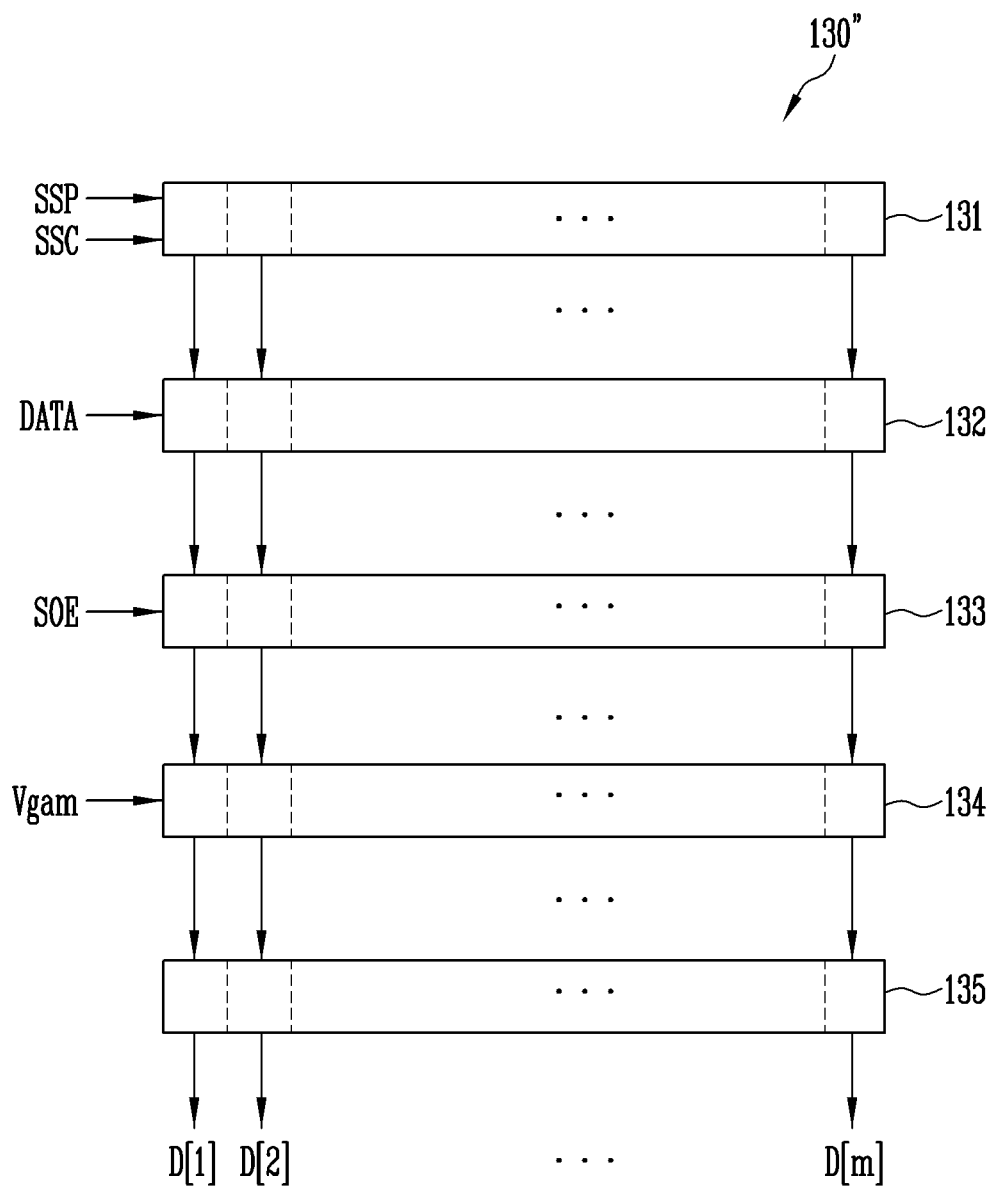
FIG. 21 schematically illustrates a data driver in accordance with an embodiment of the disclosure.

FIG. 21 illustrates a data driver 130″ in accordance with an embodiment. For example, FIG. 21 is a diagram illustrating an embodiment of the data driver 130″ which may be applied to the display device according to the embodiment of FIG. 18, and FIG. 21 illustrates a modification of the data driver 130 of FIG. 13. In FIG. 21, like reference numerals are used to denote components similar or identical to those of the above-described embodiments, and detailed descriptions thereof will be omitted.

Referring to FIGS. 18 to 21, the data driver 130″ may include m data channels electrically connected to the data line D[j] of each pixel PXL'. The data driver 130″ may generate data signals for the pixels PXL' disposed in each horizontal line (e.g., respective second data signals DS2 for the pixels PXL) by using frame data DATA and a data control signal supplied from the timing controller 140' and a gamma voltage Vgam supplied from the gamma voltage generator 160, and the data driver 130″ may then supply, during each horizontal period, the data signals to the pixels PXL' of the corresponding horizontal line.

To this end, the data driver 130″ may include a shift register circuit 131, a sampling latch circuit 132, a holding latch circuit 133, a data signal generator 134, and a buffer circuit 135. The data driver 130″ according to the foregoing embodiment may have a structure and a driving method substantially similar to those of the data driver 130 of the embodiment of FIG. 13, other than the feature that the number of data channels included in the data driver 130″ is half of that of the data driver 130 according to the embodiment of FIG. 13. Therefore, detailed descriptions of the structure and driving method of the data driver 130″ according to the present embodiment will be omitted.

Figure 22:
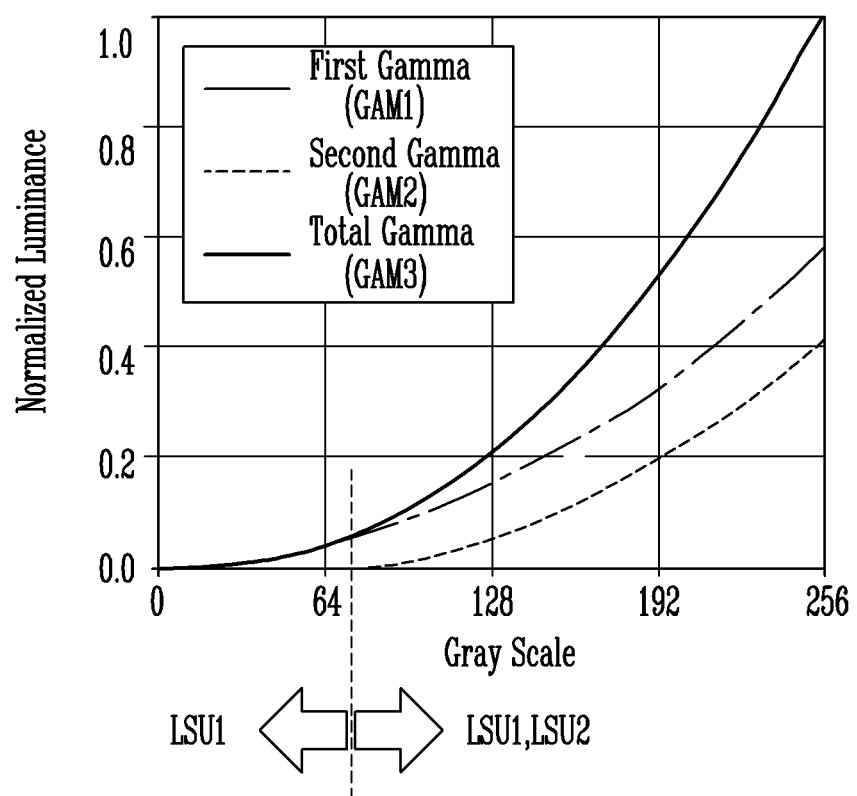
FIG. 22 schematically illustrates a gamma setting method in accordance with an embodiment of the disclosure.

FIG. 22 illustrates a gamma setting method in accordance with an embodiment. For example, FIG. 22 illustrates first and second gamma values which can be applied to the pixel PXL' according to the embodiments of FIGS. 18 and 19 and the display device including the pixel PXL'.

Referring to FIGS. 18 to 22, the first and second driving circuit PXC1 and PXC2 of each pixel PXL' may be supplied with first and second data signals DS1 and DS2 having different voltage levels. For example, a data signal output from the data driver 130″, e.g., a second data signal DS2, may be supplied to the second driving circuit PXC2, and a first data signal DS1 having a voltage lower than the voltage of the second data signal DS2 by the threshold voltage of the diode DI may be supplied to the first driving circuit PXC1.

In an embodiment, first gamma characteristics (e.g., a first gamma curve) shown by the first light source unit LSU1 that is driven by the first data signal DS1 may be substantially similar or identical to second gamma characteristics (e.g., a second gamma curve) shown by the second light source unit LSU2 that is driven by the second data signal DS2. Here, since the voltage levels of the first and second data signals DS1 and DS2 are different from each other, the luminance values of light emitted from the first and second light source units LSU1 and LSU2 in response to respective data signals supplied from the data driver 130″ to respective pixels PXL' may differ from each other. For example, in the case where both the first and seventh transistors T1 and T7 are P-type transistors, the first light source unit LSU1 that is supplied with the first data signal DS1 having a relatively low voltage level may emit light at a luminance greater than that of the second light source unit LSU2.

In the foregoing embodiment, a gamma value (e.g., a second gamma value) may be controlled such that in a low gray scale area corresponding to a predetermined reference gray scale value or less, only some light emitting elements of the light emitting elements LD provided in each pixel PXL' (e.g., only at least one first light emitting element LD1 provided in the first light source unit LSU1) are driven. Therefore, the low gray scale expression capability of the pixel PXL' and the display device including the pixel PXL' can be enhanced. Furthermore, in the other high gray scale area, the first and second light source units LSU1 and LSU2 may be driven, so that a desired luminance can be effectively displayed.

While the spirit and scope of the disclosure are described by detailed exemplary embodiments, it should be noted that the above-described embodiments are merely descriptive and should not be considered limiting. It should be understood by those skilled in the art that various changes, substitutions, and alternations may be made herein without departing from the scope of the disclosure.

The scope of the disclosure is not limited by detailed descriptions of the specification, and the claimed invention should be defined by the accompanying claims. Furthermore, all changes or modifications of the disclosure derived from the meanings and scope of the claims, and equivalents thereof should be construed as being included in the scope of the disclosure.

What is claimed is:

1. A pixel comprising:
    a first sub-emission area and a second sub-emission area that are enclosed by a bank;
    a first light source unit disposed in the first sub-emission area, the first light source unit including at least one first light emitting element electrically connected between at least one first split electrode and a second power supply;
    a second light source unit disposed in the second sub-emission area, the second light source unit including at least one second light emitting element electrically connected between at least one second split electrode separated from the at least one first split electrode and the second power supply;
    a first driving circuit electrically connected between a first power supply and the at least one first split electrode, and supplying a first driving current to the first light source unit in response to a first data signal supplied to a first data line; and a second driving circuit electrically connected between the first power supply and the at least one second split electrode, and supplying a second driving current to the second light source unit in response to a second data signal supplied to a second data line.

2. The pixel according to claim 1, wherein
the first data signal is a data signal obtained by applying a first gamma value to each pixel data, and
the second data signal is a data signal obtained by applying a second gamma value to each pixel data.

3. The pixel according to claim 1, wherein the first driving circuit comprises:
a first driving transistor electrically connected between the first power supply and the at least one first split electrode, the first driving transistor comprising a gate electrode electrically connected to a first node;
a first switching transistor electrically connected between one electrode of the first driving transistor and the first data line, the first switching transistor comprising a gate electrode electrically connected to a scan line; and
a first capacitor electrically connected between the first power supply and the first node.

4. The pixel according to claim 3, wherein the second driving circuit comprises:
a second driving transistor electrically connected between the first power supply and the at least one second split electrode, the second driving transistor comprising a gate electrode electrically connected to a second node;
a second switching transistor electrically connected between one electrode of the second driving transistor and the second data line, the second switching transistor comprising a gate electrode electrically connected to the scan line; and
a second capacitor electrically connected between the first power supply and the second node.

5. The pixel according to claim 1, wherein
a surface area of the first sub-emission area and a surface area of the second sub-emission area are equal to each other,
a number of the at least one first split electrode and a number of the at least one second split electrode are equal to each other, and
a size of the at least one first split electrode and a size of the at least one second split electrode are equal to each other.

6. The pixel according to claim 1, wherein
a surface area of the first sub-emission area and a surface area of the second sub-emission area are different from each other,
a number of the at least one first split electrode and a number of the at least one second split electrode are different from each other, and
a size of the at least one first split electrode and a size of the at least one second split electrode are different from each other.

7. The pixel according to claim 1, further comprising a diode electrically connected in a direction between the first data line and the second data line.

8. The pixel according to claim 7, wherein the first and second data signals have different voltage levels.

9. A display device comprising:
a timing controller that outputs frame data in response to input image data;
a data driver that generates at least one data signal for each pixel in response to the frame data, and outputs the data signal to data lines; and
a plurality of pixels each electrically connected to at least one data line and emitting light of a luminance corresponding to each of the at least one data signal supplied to the at least one data line,
wherein each of the plurality of pixels comprises:
a first sub-emission area and second sub-emission area that are enclosed by a bank;
a first light source unit disposed in the first sub-emission area, the first light source unit including at least one first light emitting element electrically connected between at least one first split electrode and a second power supply;
a second light source unit disposed in the second sub-emission area, the second light source unit including at least one second light emitting element electrically connected between at least one second split electrode separated from the at least one first split electrode and the second power supply;
a first driving circuit electrically connected between a first power supply and the at least one first split electrode, and supplying a first driving current to the first light source unit in response to a first data signal supplied to a first data line; and
a second driving circuit electrically connected between the first power supply and the at least one second split electrode, and supplying a second driving current to the second light source unit in response to a second data signal supplied to a second data line.

10. The display device according to claim 9, wherein each of the plurality of pixels is electrically connected to two different channels of the data driver through the first and the second data lines.

11. The display device according to claim 9, wherein the timing controller comprises:
a gamma storage that stores a first gamma value and a second gamma value different from each other for each of the plurality of pixels; and
a data converter that generates first and second converted data by respectively applying the first and the second gamma values to pixel data corresponding to each of the plurality pixels.

12. The display device according to claim 11, wherein
the data driver generates the first and the second data signals respectively in response to the first and the second converted data, and
the data driver outputs the first and the second data signals respectively to the first and the second data lines.

13. The display device according to claim 9, wherein
the data driver generates the first and the second data signals by respectively applying first and second gamma values to pixel data corresponding to each of the plurality of pixels, and
the data driver outputs the first and the second data signals respectively to the first and the second data lines.

14. The display device according to claim 9, wherein each of the plurality of pixels comprises a diode electrically connected in a direction between the first data line and the second data line.

15. The display device according to claim 14, wherein each of the plurality of pixels is electrically connected to each channel of the data driver through one of the first and the second data lines.

16. The display device according to claim 9, wherein
the first data line is supplied with the first data signal obtained by applying a first gamma value to pixel data corresponding to each of the plurality of pixels, and the second data line is supplied with the second data signal obtained by applying a second gamma value to the pixel data corresponding to each of the plurality of pixels.

17. The display device according to claim 9, wherein the first driving circuit comprises:
   a first driving transistor electrically connected between the first power supply and the at least one first split electrode, the first driving transistor comprising a gate electrode electrically connected to a first node;
   a first switching transistor electrically connected between one electrode of the first driving transistor and the first data line, the first switching transistor comprising a gate electrode electrically connected to a scan line; and
   a first capacitor electrically connected between the first power supply and the first node.

18. The display device according to claim 17, wherein the second driving circuit comprises:
   a second driving transistor electrically connected between the first power supply and the at least one second split electrode, the second driving transistor comprising a gate electrode electrically connected to a second node;
   a second switching transistor electrically connected between one electrode of the second driving transistor and the second data line, the second switching transistor comprising a gate electrode electrically connected to the scan line; and
   a second capacitor electrically connected between the first power supply and the second node.

19. The display device according to claim 9, wherein
   a surface area of the first sub-emission area and a surface area of the second sub-emission area are equal to each other,
   a number of the at least one first split electrode and a number of the at least one second split electrode are equal to each other, and
   a size of the at least one first split electrode and a size of the at least one second split electrode are equal to each other.

20. The display device according to claim 9, wherein
   a surface area of the first sub-emission area and a surface area of the second sub-emission area are different from each other,
   a number of the at least one first split electrode and a number of the at least one second split electrode are different from each other, and
   a size of the at least one first split electrode and a size of the at least one second split electrode are different from each other.

* * * * *